US012456610B2

(12) United States Patent
Cho et al.

(10) Patent No.: US 12,456,610 B2
(45) Date of Patent: Oct. 28, 2025

(54) SUBSTRATE PROCESSING APPARATUS AND SUBSTRATE PROCESSING METHOD

(71) Applicant: SAMSUNG ELECTRONICS CO., LTD., Suwon-si (KR)

(72) Inventors: Sung Hwi Cho, Gwangju-si (KR); Sung-Yeol Kim, Yongin-si (KR); Mee Hyun Lim, Seoul (KR); Sung Yong Lim, Seoul (KR); Seong Ha Jeong, Hwaseong-si (KR); Woong Jin Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 17/856,413

(22) Filed: Jul. 1, 2022

(65) Prior Publication Data

US 2023/0116739 A1 Apr. 13, 2023

(30) Foreign Application Priority Data

Oct. 12, 2021 (KR) ........................ 10-2021-0134771

(51) Int. Cl.
*H01J 37/32* (2006.01)

(52) U.S. Cl.
CPC .. *H01J 37/32651* (2013.01); *H01J 37/32642* (2013.01); *H01J 2237/3343* (2013.01)

(58) Field of Classification Search
CPC ........... H01J 37/32651; H01J 37/32642; H01J 2237/3343; H01J 37/3211; H01J 37/3244; H01J 2237/3321; H01J 2237/334; C23C 16/46–466
See application file for complete search history.

(56) References Cited

U.S. PATENT DOCUMENTS

| | | | |
|---|---|---|---|
| 6,169,265 | B1 | 1/2001 | Dvoskin et al. |
| 6,232,723 | B1 | 5/2001 | Alexeff |
| 7,328,885 | B2 | 2/2008 | Schuermann et al. |

(Continued)

FOREIGN PATENT DOCUMENTS

| | | | |
|---|---|---|---|
| JP | 2012-64671 | A | 3/2012 |
| KR | 19990082115 | A | 11/1999 |

(Continued)

OTHER PUBLICATIONS

Communication dated Aug. 14, 2025, issued by the Korean Patent Office in Korean Application No. 10-2021-0134771.

*Primary Examiner* — Aiden Lee
(74) *Attorney, Agent, or Firm* — Sughrue Mion, PLLC

(57) ABSTRACT

A substrate processing apparatus is provided. The substrate processing apparatus includes a chamber comprising a support, the support configured to have mounted thereon a substrate; at least one channel disposed in the chamber and into which a conductive fluid or a non-conductive fluid is configured to be injected; and a control unit. The control unit includes a first pump and a second pump configured to respectively supply the conductive fluid and the non-conductive fluid to the at least one channel; and a first valve configured to receive the conductive fluid and the non-conductive fluid from the first pump and the second pump, respectively, and control proportions at which the conductive fluid and the non-conductive fluid are injected into the at least one channel.

20 Claims, 23 Drawing Sheets

(56) References Cited

U.S. PATENT DOCUMENTS

| | | | |
|---|---|---|---|
| 9,018,604 B2 | 4/2015 | Niimi et al. | |
| 10,192,722 B2 | 1/2019 | Okino et al. | |
| 2011/0170649 A1 | 7/2011 | Kotschenreuther et al. | |
| 2013/0260321 A1 * | 10/2013 | Colannino | F23D 14/68 431/2 |
| 2014/0004706 A1 * | 1/2014 | Miya | H01L 21/67017 156/345.37 |
| 2014/0027092 A1 * | 1/2014 | Ranish | C23C 16/46 165/64 |
| 2019/0348306 A1 * | 11/2019 | Koltonski | H01L 21/3065 |
| 2020/0194241 A1 * | 6/2020 | Lim | H01J 37/32091 |

FOREIGN PATENT DOCUMENTS

| | | | |
|---|---|---|---|
| KR | 20000053175 | A | 8/2000 |
| KR | 1020050103201 | A | 10/2005 |
| KR | 1020200123442 | A | 10/2020 |
| KR | 10-2184088 | B1 | 11/2020 |
| KR | 1020210024149 | A | 3/2021 |
| WO | 2020/219304 | A1 | 10/2020 |

* cited by examiner

SUBSTRATE PROCESSING APPARATUS AND SUBSTRATE PROCESSING METHOD

CROSS-REFERENCE TO THE RELATED APPLICATION

This application claims priority from Korean Patent Application No. 10-2021-0134771 filed on Oct. 12, 2021 in the Korean Intellectual Property Office, and all the benefits accruing therefrom under 35 U.S.C. 119, the contents of which in its entirety are herein incorporated by reference.

BACKGROUND

1. Technical Field

Embodiments of the present disclosure relate to a substrate processing apparatus and a substrate processing method.

2. Description of the Related Art

When a semiconductor device or a display device is manufactured, various processes such as etching, ashing, ion implantation, thin film deposition, and cleaning processes are performed. A plasma apparatus may be used in the various processes.

In such a plasma apparatus, when radio frequency (RF) power is supplied, a gas inside a chamber may be affected by an electromagnetic field to form a plasma field. In this case, the plasma field may be formed to be asymmetrically distributed in respective regions of a substrate.

As described above, when the plasma field is asymmetrically formed, an etching or deposition process may be non-uniformly performed.

Therefore, there is a need to freely adjust a distribution of a plasma field so as to compensate for such asymmetry.

SUMMARY

Aspects of the present disclosure provide a substrate processing apparatus in which a plasma field is freely adjustable by controlling positions and proportions at which a conductive fluid and a non-conductive fluid are injected.

Aspects of the present disclosure also provide a substrate processing method in which a plasma field is freely adjustable by controlling positions and proportions at which a conductive fluid and a non-conductive fluid are injected.

According to embodiments, a substrate processing apparatus is provided. The substrate processing apparatus includes: a chamber comprising a support, the support configured to have mounted thereon a substrate; at least one channel disposed in the chamber and into which a conductive fluid or a non-conductive fluid is configured to be injected; and a control unit comprising: a first pump and a second pump configured to respectively supply the conductive fluid and the non-conductive fluid to the at least one channel; and a first valve configured to receive the conductive fluid and the non-conductive fluid from the first pump and the second pump, respectively, and control proportions at which the conductive fluid and the non-conductive fluid are injected into the at least one channel.

According to embodiments, a substrate processing apparatus is provided. The substrate processing apparatus includes: a chamber in which a plasma process is configured to be performed; a support which is surrounded by a sidewall of the chamber, the support configured to have mounted thereon a substrate; a shower head disposed above the support, and configured to spray a process gas on the substrate; a ring disposed within the chamber, and configured to be at both sides of the substrate while the substrate is mounted on the support; a shield member, comprising at least one body, disposed below the ring; at least one channel into which a conductive fluid, for forming a plasma field, and a non-conductive fluid are configured to be injected; and a control unit comprising at least one from among a pump and a valve, and configured to alternately supply the conductive fluid and the non-conductive fluid to the at least one channel such that the non-conductive fluid is provided between portions of the conductive fluid within the at least one channel, and control proportions at which the conductive fluid and the non-conductive fluid are injected into the at least one channel.

According to embodiments, a substrate processing apparatus is provided. The substrate processing apparatus includes: a chamber in which a plasma process is performed, a support which is disposed in the chamber and on which a substrate is mounted, at least one channel into which a conductive fluid, for forming a plasma field, or a non-conductive fluid is injected, a first pump and a second pump supplying the conductive fluid and the non-conductive fluid to the at least one channel respectively, a first valve controlling proportions, at which the conductive fluid and the non-conductive fluid are injected into the at least one channel, and a second valve connected to the first valve, distributing the conductive fluid or the non-conductive fluid to the at least one channel.

According to embodiments, a substrate processing method using a substrate processing apparatus including a chamber in which a plasma process is performed, a support which is disposed in the chamber and on which a substrate is mounted, and at least one channel into which a conductive fluid, for forming a plasma field, or a non-conductive fluid is injected, is provided. The substrate processing method includes: supplying the conductive fluid and the non-conductive fluid to the at least one channel using a first pump and a second pump, respectively; controlling proportions, at which the conductive fluid and the non-conductive fluid are injected into the at least one channel, using a first valve; and distributing the conductive fluid or the non-conductive fluid to the at least one channel using a second valve connected to the first valve.

It should be noted that aspects and embodiments of the present disclosure are not limited to the above-described aspects and embodiments, and other aspects and embodiments of the present disclosure will be apparent to those skilled in the art from the following descriptions.

BRIEF DESCRIPTION OF THE DRAWINGS

The above and other aspects and features of embodiments of the present disclosure will become more apparent by describing non-limiting example embodiments thereof in detail with reference to the attached drawings, in which.

DETAILED DESCRIPTION

Figure 1:
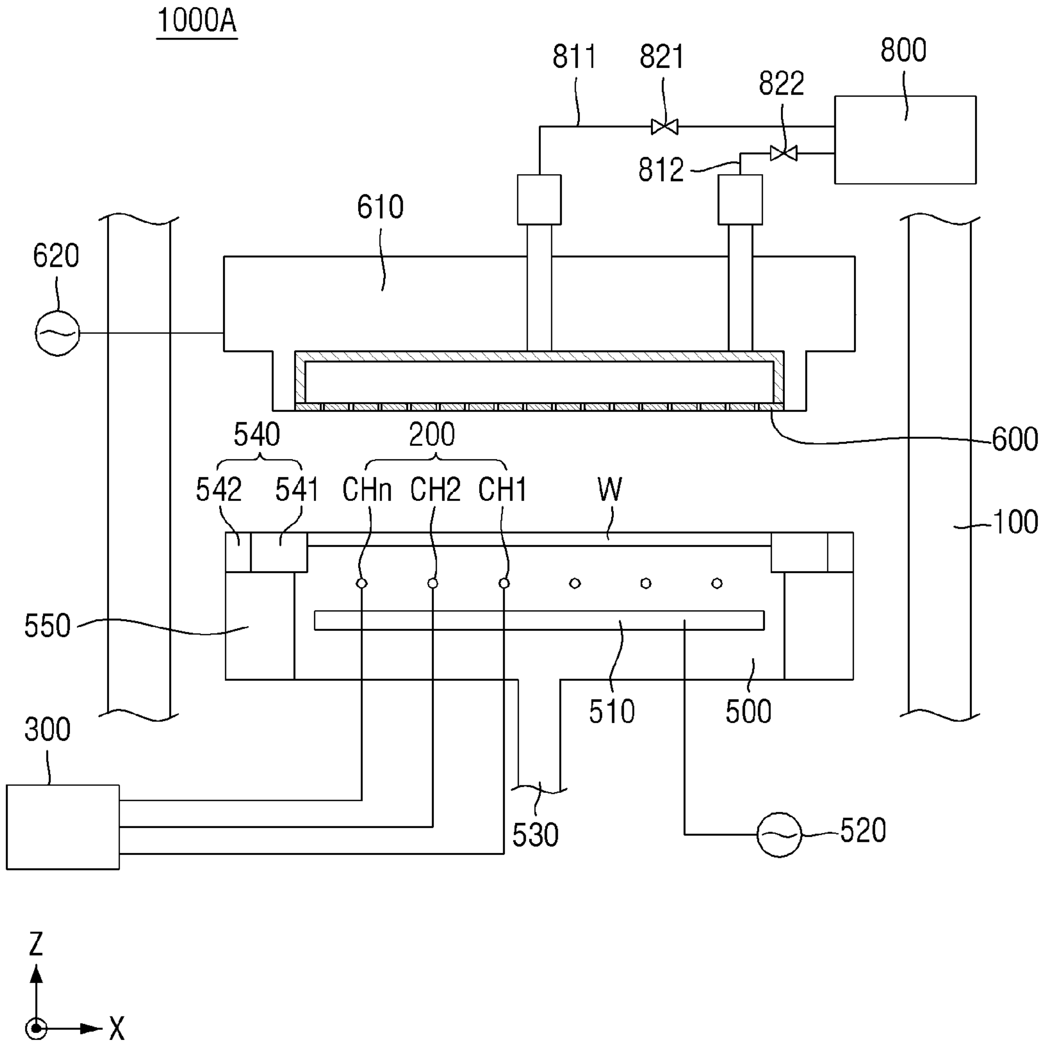
FIG. 1 is a view illustrating a substrate processing apparatus according to some example embodiments of the present disclosure.

Hereinafter, non-limiting example embodiments of the present disclosure will be described in detail with reference to the accompanying drawings. The same reference numerals will designate the same elements throughout the drawings, and redundant description of the same elements will be omitted.

Figure 2:
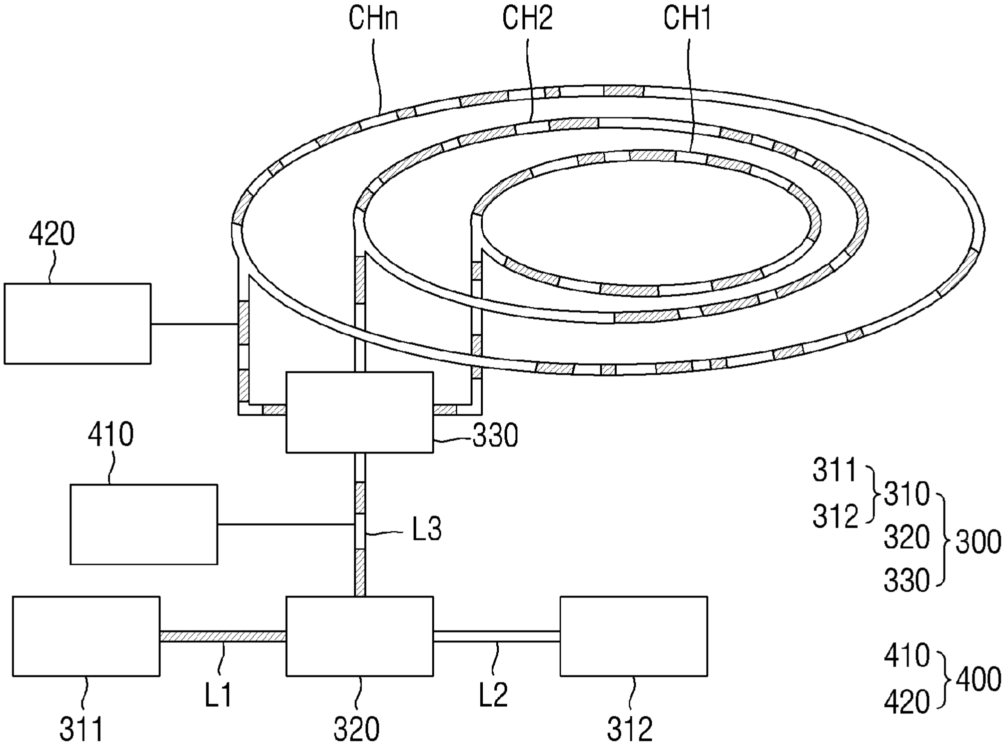
FIG. 2 is a view for describing a control unit and a channel of the substrate processing apparatus of FIG. 1.

FIG. 1 is a view illustrating a substrate processing apparatus according to some example embodiments of the present disclosure. FIG. 2 is a view for describing a control unit and a channel of the substrate processing apparatus of FIG. 1. FIGS. 3A to 3E are views illustrating the channel viewed from above in the substrate processing apparatus according to some example embodiments of the present disclosure. FIG. 4 shows views for describing a conductive fluid and a transport fluid injected into the channel in the substrate processing apparatus according to some example embodiments of the present disclosure.

Referring to FIGS. 1-2, a substrate processing apparatus 1000A according to some example embodiments of the present disclosure includes a chamber 100, a channel 200, and a control unit 300, and further includes a sensor unit 400, a support member 500 (also referred to as a support), a ring 540, a shield member 550, and a shower head 600.

The chamber 100 refers to an internal space in which a plasma process is performed. The plasma process may include, for example, etching, ashing, ion implantation, thin film deposition, and cleaning processes, but embodiments of the present disclosure are not limited thereto. The chamber 100 may be, for example, a cylindrical vacuum chamber and may include a metal such as aluminum or stainless steel, but embodiments of the present disclosure are not limited thereto.

The support member 500, a first electrode 510, and a second electrode 610 are disposed in the chamber 100. A substrate W on which a plasma process is performed is mounted on the support member 500.

The support member 500 serves as a susceptor for supporting the substrate W. For example, the support member 500 may be an electrostatic chuck for holding the substrate W on the support member 500 with an electrostatic attraction force.

The ring 540 disposed around the substrate W to support the substrate W may be provided on the support member 500. The ring 540 may include a focus ring 541 and an edge ring 542 surrounding the focus ring 541.

The focus ring 541 and the edge ring 542 may include an insulating material. For example, the focus ring 541 and the edge ring 542 may include ceramic, silicon carbide (SiC), or the like, but embodiments of the present disclosure are not limited thereto.

The first electrode 510 may be disposed in the support member 500, and the second electrode 610 may be disposed above the support member 500. The first electrode 510 is connected to a first power supply unit 520, and the second electrode 610 is connected to a second power supply unit 620.

The support member 500 may include the first electrode 510 having a disk shape under the electrostatic chuck. The first electrode 510 may be installed to be vertically movable by a driving unit 530.

The driving unit 530 may be connected to an exhaust unit installed under the chamber 100. Although not specifically shown, the exhaust unit may include a vacuum pump such as a turbo molecular pump to adjust a processing space inside the chamber 100 to pressure with a desired degree of vacuum. In addition, process by-products and residual process gases generated in the chamber 100 may be discharged through the exhaust unit.

The first power supply unit 520 supplies power for controlling ion energy of plasma to the chamber 100. When the power is supplied to the first electrode 510 of the support member 500, a voltage is induced in the substrate W disposed on the first electrode 510. A voltage of the substrate W may be controlled according to the power, and thus, ion energy of plasma generated in the chamber 100 may be controlled.

The second power supply unit 620 may be disposed inside the chamber 100 and on the shower head 600. High-frequency power may be supplied to the second electrode 610. The second power supply unit 620 may apply the power to the second electrode 610 to form plasma in the chamber 100.

A gas supply unit 800 may include gas supply pipes (e.g., a first gas supply pipe 811 and a second gas supply pipe 812) and flow rate controllers 821 and 822. The gas supply pipes may supply various gases to an upper portion and/or side surfaces of the chamber 100. For example, the gas supply pipes pass through an upper wall of the chamber 100 and include a first gas supply pipe 811 configured to supply a gas to a central portion of the substrate W and a second gas supply pipe 812 configured to supply a gas to a peripheral portion of the substrate W. The first gas supply pipe 811 and the second gas supply pipe 812 may uniformly supply various gases to respective regions of the substrate W in a plasma space inside the chamber 100.

The gas supply unit 800 may supply different gases at desired proportions. The flow rate controllers 821 and 822 may control supply flow rates of gases introduced into the chamber 100 through the first gas supply pipe 811 and the second gas supply pipe 812. The flow rate controllers 821 and 822 may independently or commonly control supply flow rates of gases supplied to the first gas supply pipe 811 and the second gas supply pipe 812. The gas supply unit 800 may supply different process gases into the chamber 100. The process gases may include inert gases.

Although not specifically shown, the substrate processing apparatus 1000A may include a temperature adjustment unit. The temperature adjustment unit may include a heater and/or a cooler. For example, the temperature adjustment unit may include a heater disposed inside the support member 500 to adjust a temperature of the support member 500 and a heater power supply unit configured to supply power to the heater.

In some example embodiments of the present disclosure, the substrate processing apparatus 1000A may be an apparatus for etching an etch target film on the substrate W disposed in the chamber 100 using inductively coupled plasma (ICP). However, plasma generated by the substrate processing apparatus 1000A is not limited to the ICP, and for example, capacitively coupled plasma or microwave plasma may be generated. In addition, embodiments of the present disclosure are not limited to an etching apparatus, and the substrate processing apparatus 1000A may be used, for example, as a deposition apparatus or a cleaning apparatus. Here, the substrate may include a semiconductor substrate, a glass substrate, or the like.

Referring to FIG. 2, the substrate processing apparatus 1000A according to some example embodiments includes the channel 200 and the control unit 300.

Figure 3A:
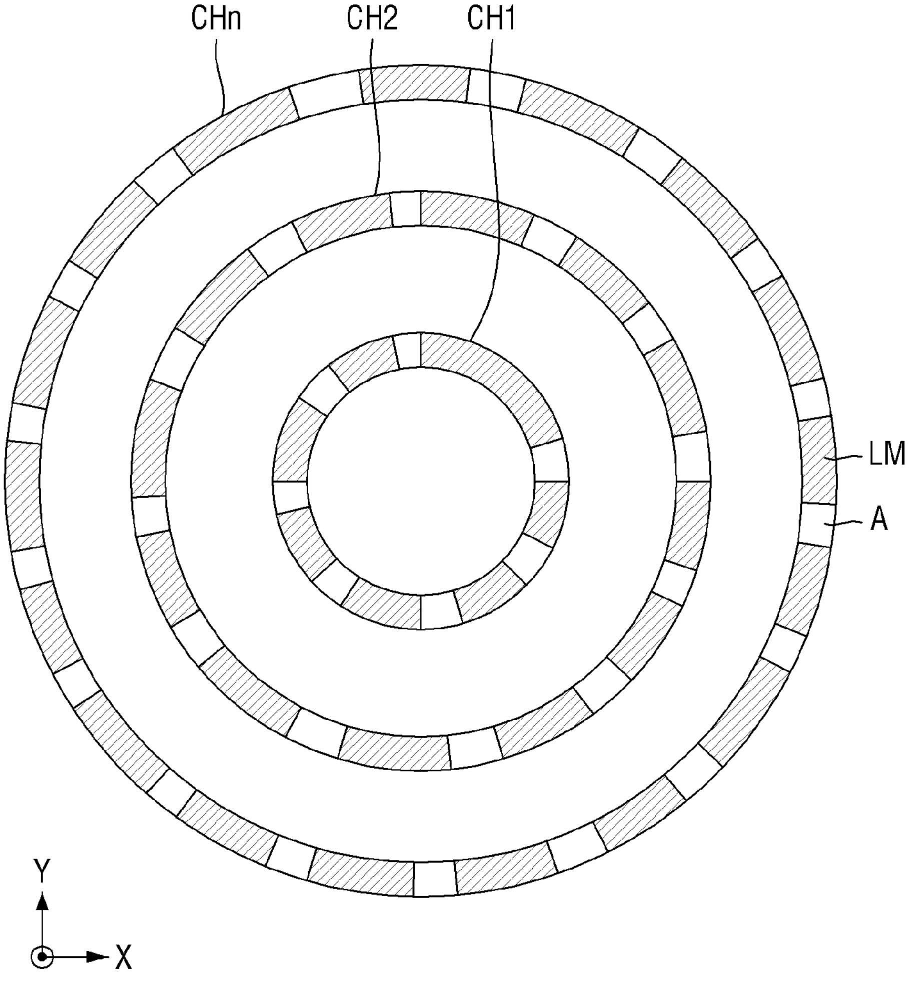
FIG. 3A is a view illustrating the channel viewed from above in the substrate processing apparatus according to some example embodiments of the present disclosure.
Figure 4:
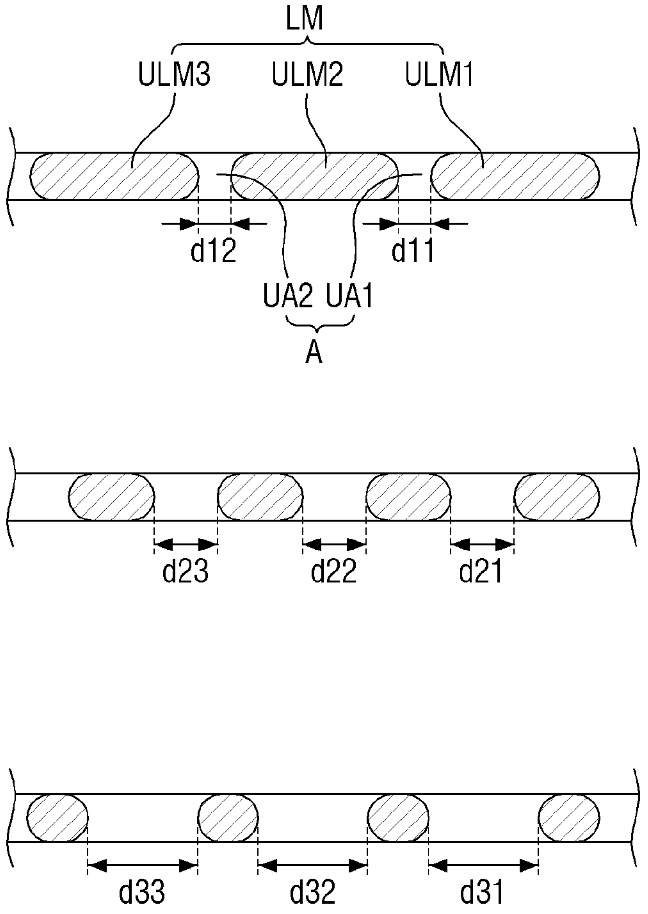
FIG. 4 shows views for describing a conductive fluid and a transport fluid injected into the channel in the substrate processing apparatus according to some example embodiments of the present disclosure.

The channel 200 may be disposed in the chamber 100 and may be a path through which a conductive fluid LM or a transport fluid A is injected (refer to, for example, FIG. 3A). The channel 200 includes a first channel CH1 adjacent to the central portion of the substrate W, an $n^{th}$ channel CHn adjacent to the peripheral portion of the substrate W, and a second channel CH2 between the first channel CH1 and the $n^{th}$ channel CHn. That is, the channel 200 may include n channels of the first to $n^{th}$ channels CH1 to CHn in a direction from the central portion to the peripheral portion of the substrate W. That is, the channel 200 may be formed as a plurality of n channels (wherein n is a natural of 1 or more).

The channel 200 may be made of a non-conductive material. For example, the channel 200 may include an insulating material or a dielectric material. However, embodiments of the present disclosure are not limited thereto.

The control unit 300 includes a first pump 311 and a second pump 312 which respectively supply the conductive fluid LM and the non-conductive fluid A to the channel 200 and a first valve 320 which receives the conductive fluid LM and the non-conductive fluid A from the first pump 311 and the second pump 312 and controls proportions at which the conductive fluid LM and the non-conductive fluid A are injected into the channel 200.

In some example embodiments, the conductive fluid LM may form a plasma field. In some example embodiments, the conductive fluid LM may be a metal that is liquid at room temperature. When the conductive fluid LM is a liquid metal, the conductive fluid LM may include at least one selected from among mercury (Hg), cesium (Cs), radium (Ra), francium (Fr), and rubidium (Rb). In addition, the conductive fluid LM may be eutectic gallium-indium (EGaIn), that is an alloy of gallium and indium, and galinstan, that is an alloy of gallium-indium-tin. In this case, the conductive fluid LM may include at least one selected from among gallium (Ga), indium (In), and tin (Sn). The transport fluid A may be a fluid for transporting the conductive fluid LM inside the channel 200. For example, the transport fluid A may be at least one selected from among deionized water (DIW), air, and oil. In some example embodiments, the transport fluid A may be a non-conductive fluid. However, embodiments of the present disclosure are not limited thereto.

Proportions of the conductive fluid LM and the transport fluid A injected into each of the plurality of channels (e.g., the first channel CH1, the second channel CH2, and the $n^{th}$ channel CHn) are controlled by the first valve 320. That is, the first valve 320 may control proportions of the conductive fluid LM and the transport fluid A in the first to $n^{th}$ channels CH1, CH2, and CHn.

A proportion of each of the conductive fluid LM and the transport fluid A injected into the first channel CH1 and a proportion of each of the conductive fluid LM and the transport fluid A injected into the second channel CH2 are individually controlled by the first valve 320. For example, a proportion of each of the conductive fluid LM and the transport fluid A injected into the first channel CH1 may be different from a proportion of each of the conductive fluid LM and the transport fluid A injected into the second channel CH2. For example, proportions of the conductive fluid LM and the transport fluid A may be 75% and 25% in one channel from among the first to $n^{th}$ channels CH1, CH2, and CHn, respectively. However, embodiments of the present disclosure are not limited thereto, and proportions of the conductive fluid LM and the transport fluid A in channels from among the first to $n^{th}$ channels CH1, CH2, or CHn may be variously controlled.

The sensor unit 400 may be used to detect a plasma field by sensing the conductive fluid LM passing through at least one of the first valve 320 and a second valve 330. The sensor unit 400 may include at least one of a first sensor unit 410 disposed between the first valve 320 and the second valve 330 and a second sensor unit 420 disposed between the second valve 330 and the first to $n^{th}$ channels CH1, CH2, and CHn.

The first sensor unit 410 may be disposed between the first valve 320 and the second valve 330 to sense the conductive fluid LM passing through the first valve 320. In this case, the first sensor unit 410 may detect a plasma field formed by the conductive fluid LM passing through the first valve 320.

For example, referring to FIG. 3A, in one channel, a proportion of a region occupied by the conductive fluid LM may be greater than a proportion of a region occupied by the transport fluid A.

Figure 3B:
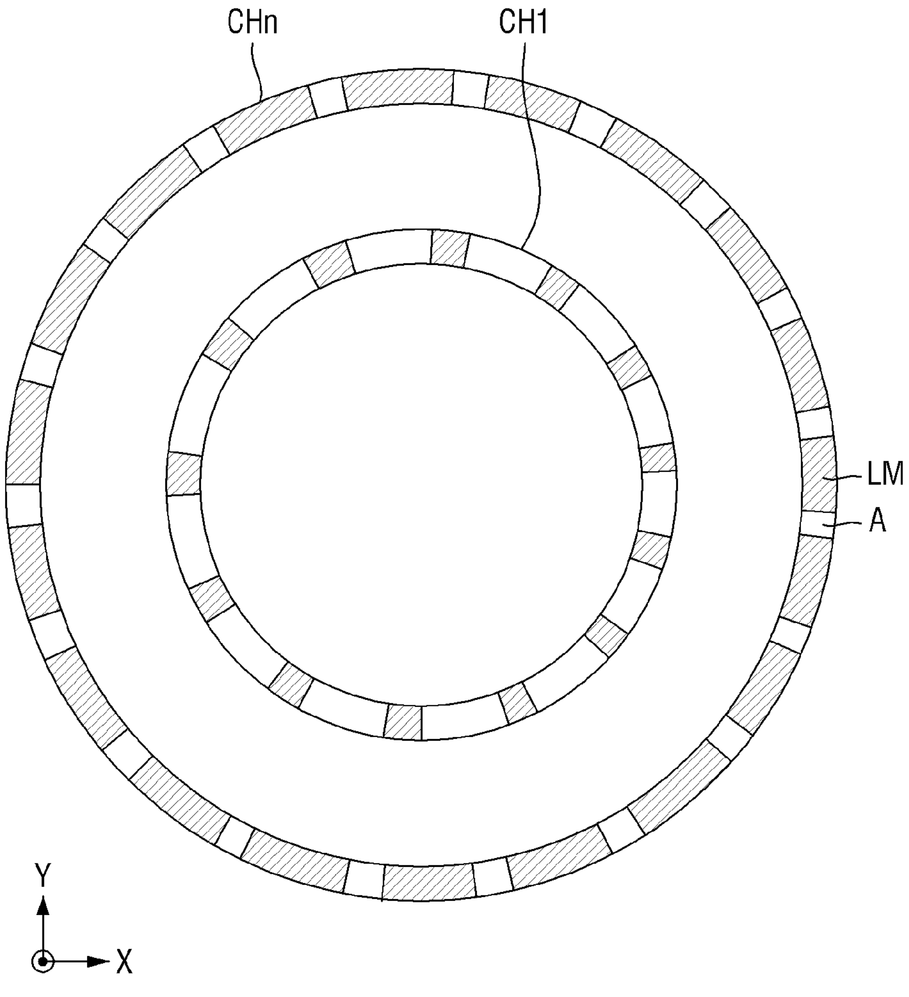
FIG. 3B is a view illustrating the channel viewed from above in the substrate processing apparatus according to some example embodiments of the present disclosure.

For example, referring to FIG. 3B, in the first channel CH1 adjacent to the central portion of the substrate W, a proportion of a region occupied by the conductive fluid LM may be smaller than a proportion of a region occupied by the transport fluid A. Meanwhile, in the $n^{th}$ channel CHn adjacent to the peripheral portion of the substrate W, a proportion of a region occupied by the conductive fluid LM may be greater than a proportion of a region occupied by the transport fluid A.

Figure 3C:
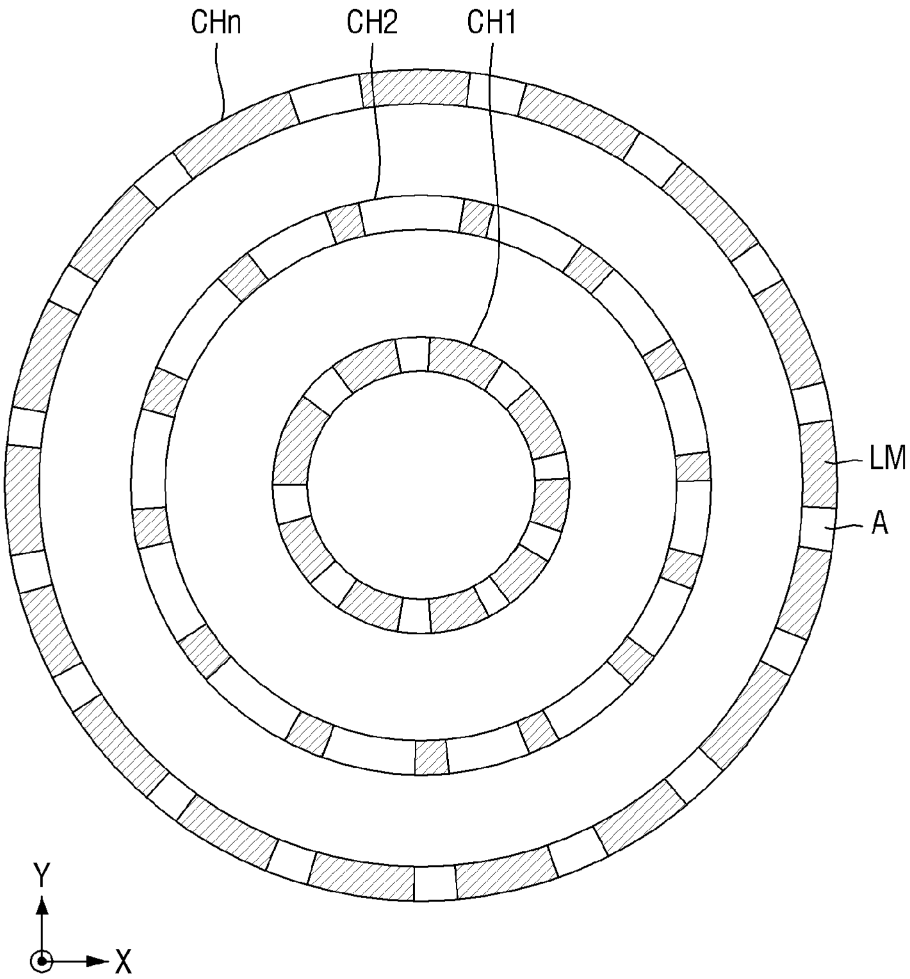
FIG. 3C is a view illustrating the channel viewed from above in the substrate processing apparatus according to some example embodiments of the present disclosure.

For example, referring to FIG. 3C, in the first channel CH1 adjacent to the central portion of the substrate W, a proportion of a region occupied by the conductive fluid LM may be greater than a proportion of a region occupied by the transport fluid A. In addition, in the $n^{th}$ channel CHn adjacent to the peripheral portion of the substrate W, a proportion of a region occupied by the conductive fluid LM may be greater than a proportion of a region occupied by the transport fluid A. Meanwhile, in the second channel CH2 adjacent between the central portion and the peripheral portion of the substrate W, a proportion of a region occupied by the conductive fluid LM may be smaller than a proportion of a region occupied by the transport fluid A.

Figure 3D:
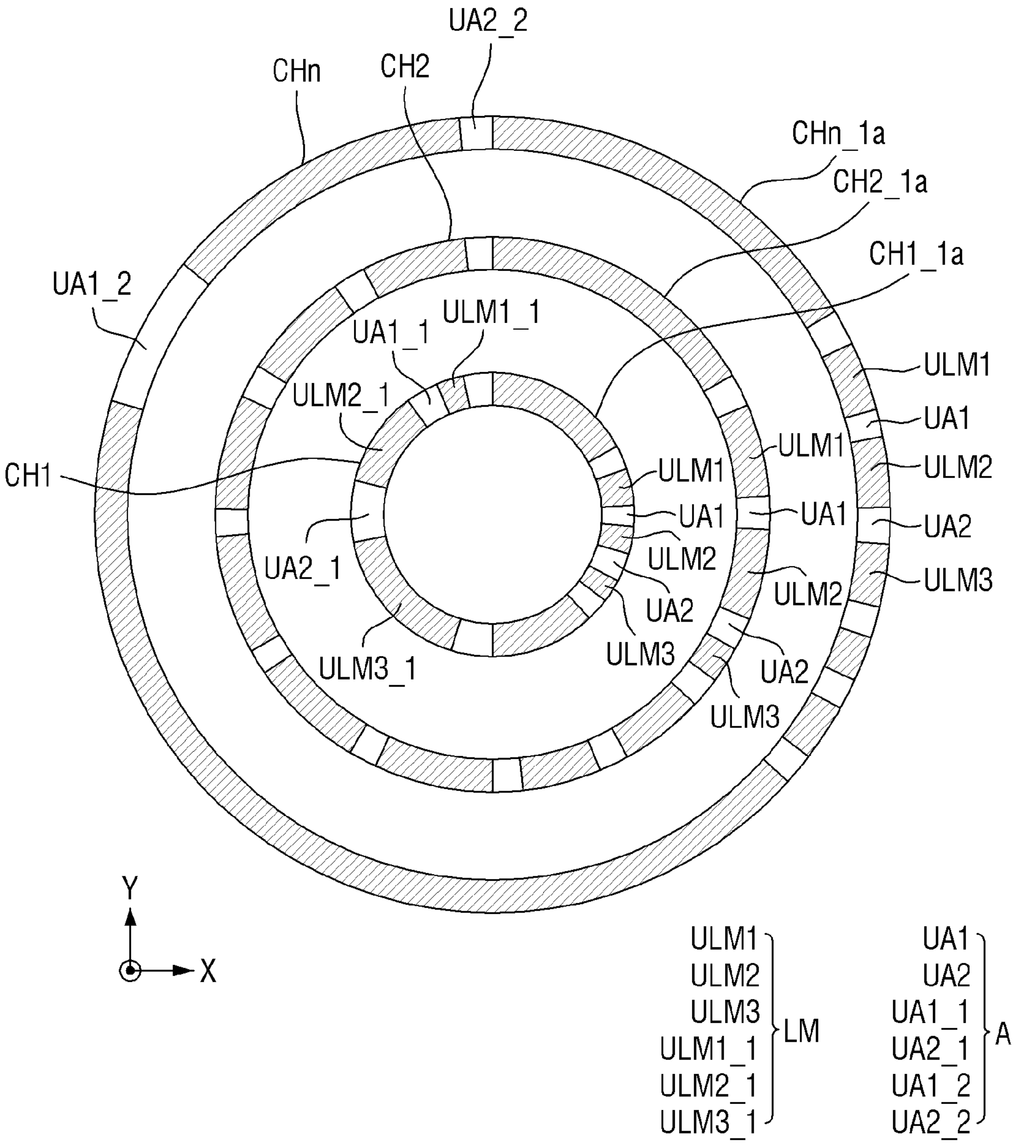
FIG. 3D is a view illustrating the channel viewed from above in the substrate processing apparatus according to some example embodiments of the present disclosure.

Meanwhile, in addition to the example embodiments shown in FIGS. 3A to 3C, an injection proportion of the conductive fluid LM may be controlled differently for each of the first to $n^{th}$ channels CH1, CH2, and CHn or different for one from among the first to $n^{th}$ channels CH1, CH2, and CHn. Referring to FIGS. 3D and 4, the conductive fluid LM and the transport fluid A may include a first unit transport fluid UA1 placed between a first unit conductive fluid ULM1 and a second unit conductive fluid ULM2, and a second unit transport fluid UA2 spaced apart from the first unit transport fluid UA1 and placed between the second unit conductive fluid ULM2 and a third unit conductive fluid ULM3. An injection proportion of each of the first conductive fluid ULM1, the second conductive fluid ULM2, and the third conductive fluid ULM3 and an injection proportion of each of the first unit transport fluid UA1 and the second unit transport fluid UA2 may be variously controlled.

Referring to FIG. 3D, a distance between the first unit conductive fluid ULM1, the second unit conductive fluid ULM2, and the third unit conductive fluid ULM3 and a distance between the first unit transport fluid UA1 and the second unit transport fluid UA2 may be different for each of the first to $n^{th}$ channels CH1, CH2, and CHn. For example, a distance between the first unit conductive fluid ULM1 and the second unit conductive fluid UML2 of the first channel CH1 may be shorter than a distance between the first unit conductive fluid ULM1 and the second unit conductive fluid UML2 of the second channel CH2 or the $n^{th}$ channel CHn. In addition, a distance between the first unit transport fluid UA1 and the second unit transport fluid UA2 of the second channel CH2 or the $n^{th}$ channel CHn may be longer than a distance between the first unit transport fluid UA1 and the second unit transport fluid UA2 of the first channel CH1.

In addition, referring to FIG. 3D, in one channel from among the first to $n^{th}$ channels CH1, CH2, and CHn, regions occupied by the first unit conductive fluid ULM1, the second unit conductive fluid ULM2, and the third unit conductive fluid ULM3 may be different from each other, and regions occupied by the first unit transport fluid UA1 and the second unit transport fluid UA2 may be different from each other. That is, a region occupied by the conductive fluid LM or the transport fluid A in each of the first to $n^{th}$ channels CH1, CHn, and CH2 may not be constant.

For example, in the first channel CH1, a region occupied by a first-first unit conductive fluid ULM1_1 may be smaller than a region occupied by a second-first unit conductive fluid UML2_1, and the region occupied by the second-first unit conductive fluid ULM2_1 may be smaller than a region occupied by a third-first unit conductive fluid UML3_1.

In addition, for example, in the first channel CH1, a region occupied by a first-first unit transport fluid UA1_1 may be smaller than a region occupied by a second-first unit transport fluid UA2_1. Furthermore, in the $n^{th}$ channel CHn, a region occupied by a first-second unit transport fluid UA1_2 may be different from a region occupied by a second-second unit transport fluid UA2_2.

In addition, referring to FIG. 3D, in each of the first to $n^{th}$ channels CH1, CHn, and CH2, a proportion of a region occupied by the conductive fluid LM may be different from a proportion of a region occupied by the transport fluid A. For example, based on an upper surface of the substrate W, partial regions CH1_1*a*, CH2_1*a*, and CHn_1*a* of the channels may be filled with only the conductive fluid LM.

Figure 3E:
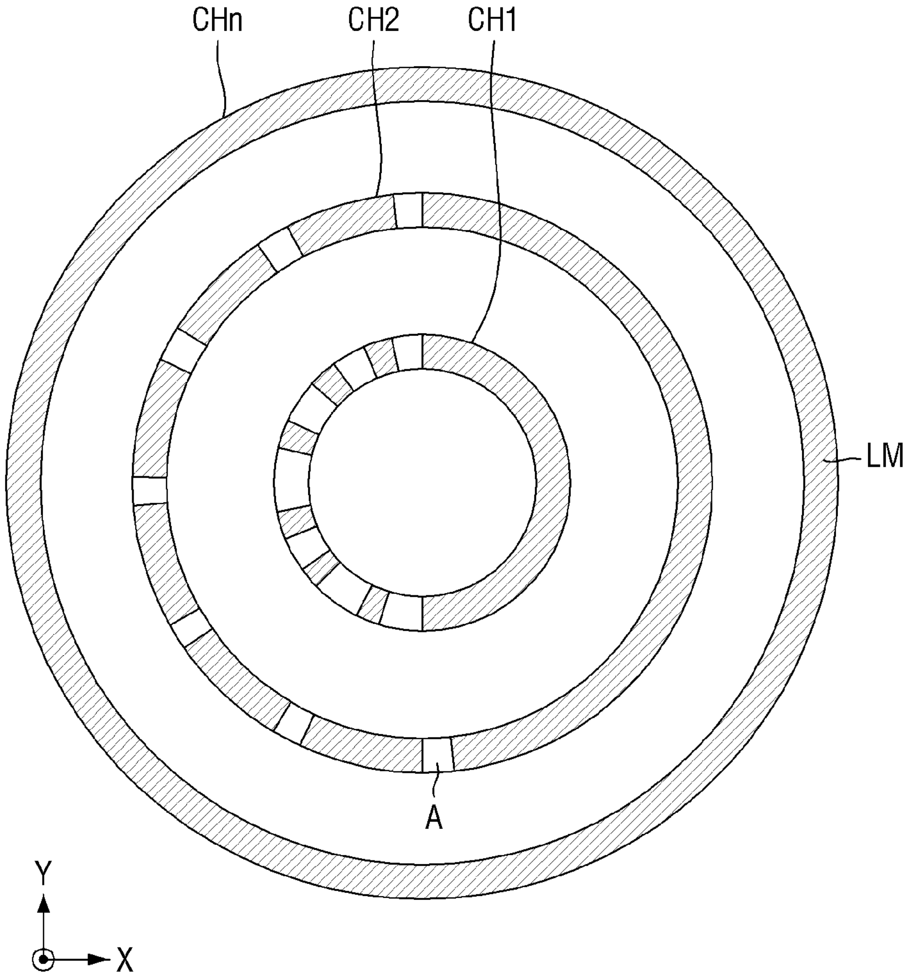
FIG. 3E is a view illustrating the channel viewed from above in the substrate processing apparatus according to some example embodiments of the present disclosure.

More specifically, referring to FIG. 3E, in the first channel CH1 adjacent to the central portion of the substrate W, based on the upper surface of the substrate W, a region corresponding to about half of the first channel CH1 may be filled with only the conductive fluid LM, and in a region corresponding to the other about half thereof, a proportion of a region occupied by the conductive fluid LM may be smaller than a proportion of a region occupied by the transport fluid A. In addition, the $n^{th}$ channel CHn adjacent to the peripheral portion of the substrate W may be filled with only the conductive fluid LM. Meanwhile, in the second channel CH2 adjacent between the central portion and the peripheral portion of the substrate W, based on the upper surface of the substrate W, a region corresponding to half of the second channel CH2 may be filled with only the conductive fluid LM, and a proportion of a region occupied by the conductive fluid LM may be greater than a proportion of a region occupied by the transport fluid A.

Furthermore, although not specifically shown, for example, based on the upper surface of the substrate W, a region corresponding to ¼ of each of the first to $n^{th}$ channels CH1, CH2, and CHn may be filled with only the conductive fluid LM. In addition, for example, in all of the first to $n^{th}$ channels CH1, CH2, and CHn or at least one from among the first to $n^{th}$ channels CH1, CH2, and CHn, a region occupied by the conductive fluid LM may not be present. In this case, all of the first to $n^{th}$ channels CH1, CH2, CHn or at least one from among the first to $n^{th}$ channels CH1, CH2, and CHn may be filled with only the transport fluid A.

However, embodiments of the present disclosure are not limited thereto. Since proportions of the conductive fluid LM and the transport fluid A injected into each of the first to $n^{th}$ channels CH1, CH2, and CHn are individually controlled, proportions of the conductive fluid LM and the transport fluid A injected into each of the first to $n^{th}$ channels CH1, CH2, and CHn are not limited to the above-described example embodiments and may vary in various example embodiments. That is, as long as a desired plasma field is formed by compensating for asymmetry of a plasma field, the number, position, and proportion of the first to $n^{th}$ channels CH1, CH2, and CHn filled with the conductive fluid LM are not limited to those shown in FIGS. 3A to 3E.

The first valve 320 may control the conductive fluid LM and the transport fluid A so as to be alternately injected. Specifically, referring to FIG. 4, when a first unit time has elapsed from a time point at which the first unit conductive fluid ULM1 is injected, the first valve 320 may control the second unit conductive fluid ULM2 so as to be injected, and when a second unit time has elapsed from a time point at which the second unit conductive fluid ULM2 is injected, the first valve 320 may control the third unit conductive fluid ULM3 so as to be injected. When the first unit time and the second unit time are the same, a first unit distance d11 between the first unit conductive fluid ULM1 and the second unit conductive fluid ULM2 and may be the same as a second unit distance d12 between the second unit conductive fluid ULM2 and the third unit conductive fluid ULM3. When the first unit time and the second unit time are different, a first unit distance d11, d21, or d31 between the first unit conductive fluids ULM1 and the second unit conductive fluid ULM2 may be different from a second unit distance d12, d22, or d32 between the second unit conductive fluid ULM2 and the third unit conductive fluid ULM3. Meanwhile, the distance between the first unit conductive fluid ULM1 and the second unit conductive fluid ULM2 and the distance between the second unit conductive fluid ULM2 and the third unit conductive fluid ULM3 may be variously adjusted. That is, as long as a desired plasma field is formed by compensating for asymmetry of a plasma field, the distance between the first unit conductive fluid ULM1 and the second unit conductive fluid ULM2 and the distance between the second unit conductive fluid ULM2 and the third unit conductive fluid ULM3 are not limited to the above-described example embodiment and may be variously adjusted.

The conductive fluid LM is transported from the first pump 311 to the first valve 320 through a first flow path L1 connected to the first pump 311. The transport fluid A is transported from the second pump 312 to the first valve 320 through a second flow path L2 connected to the second pump 312.

A third flow path L3 transports the conductive fluid LM and the transport fluid A having a specific proportion by the first valve 320 to the second valve 330.

The second valve 330 distributes the conductive fluid LM or the transport fluid A, which passes through the first valve 320, to at least one from among the first to $n^{th}$ channels CH1, CH2, and CHn. The first to $n^{th}$ channels CH1, CH2, and CHn into which the conductive fluid LM or the transport fluid A is injected may be selected by the second valve 330.

The second sensor unit 420 may be disposed between the second valve 330 and the first to $n^{th}$ channels CH1, CH2, and CHn to sense the conductive fluid LM passing through the second valve 330. In this case, the second sensor unit 420 may detect a plasma field formed by the conductive fluid LM passing through the second valve 330.

Meanwhile, unlike that shown in FIG. 2, the first to $n^{th}$ channels CH1, CH2, and CHn may not have a concentric circle shape. Centers of the first to $n^{th}$ channels CH1, CH2, and CHn may not coincide with each other. In addition, the first to $n^{th}$ channels CH1, CH2, and CHn may have a vertically stacked shape or may not have a vertically stacked shape. That is, as long as a desired plasma field is formed by compensating for asymmetry of a plasma field, the number and position of the first to $n^{th}$ channels CH1, CH2, and CHn filled with the conductive fluid LM are not limited to those shown in FIGS. 2 and 3A-E.

In a plasma apparatus, when RF power is supplied, a gas inside the chamber 100 may be affected by an electromagnetic field to form a plasma field. In this case, the plasma field may be formed to be asymmetrically distributed in respective regions of the substrate W. As described above, when the plasma field is asymmetrically formed, an etching or deposition process may be non-uniformly performed.

According to some example embodiments, a plasma field may be adjusted by controlling proportions at which the conductive fluid LM and the non-conductive fluid A are injected. In addition, an injection proportion of a fluid is controlled, thereby minimizing replacement of components damaged over time and also freely controlling a plasma field.

Hereinafter, a substrate processing apparatus according to some example embodiments of the present disclosure will be described with reference to FIGS. 5 to 6D. For convenience of description, differences from the substrate processing apparatus shown in FIGS. 1 to 4 will be mainly described.

Figure 5:
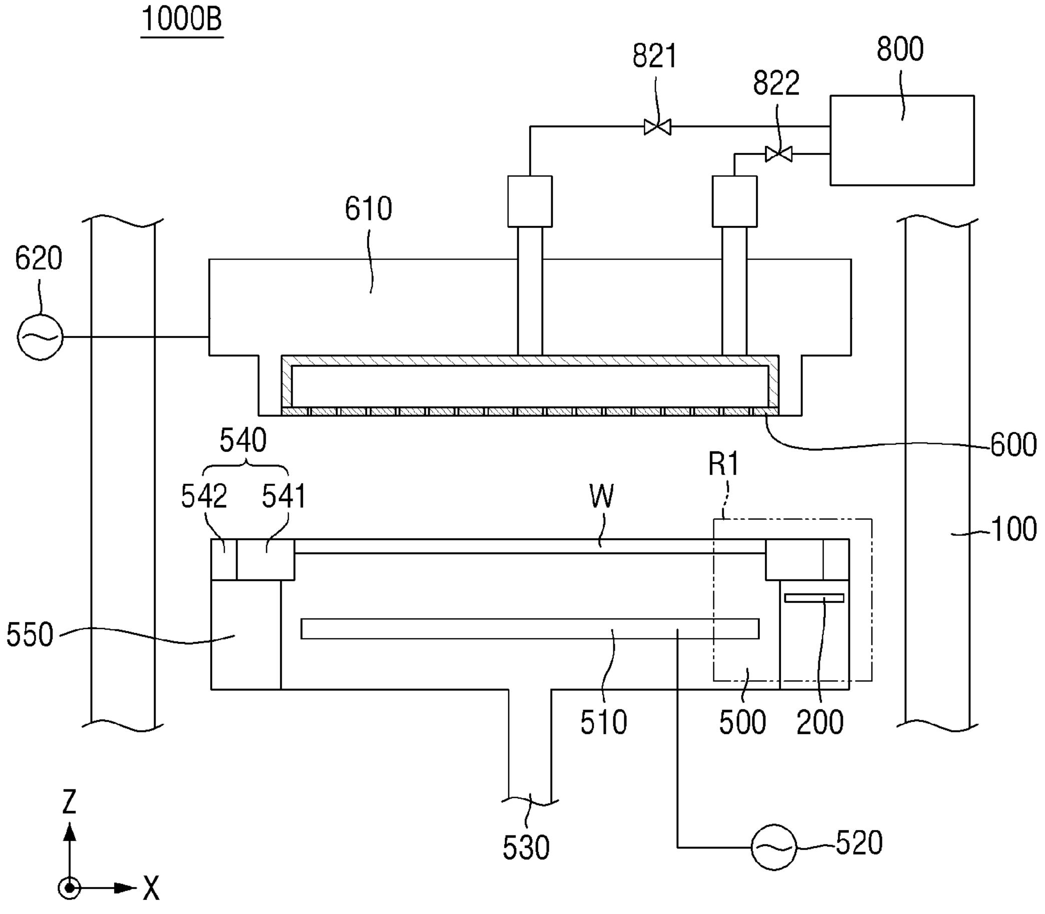
FIG. 5 is a view illustrating a substrate processing apparatus according to some example embodiments of the present disclosure.

FIG. 5 is a view illustrating a substrate processing apparatus 1000B according to some example embodiments of the present disclosure. FIGS. 6A to 6D are views for describing a control unit and a channel of the substrate processing apparatus 1000B of FIG. 5.

Referring to FIG. 5, a channel 200 may be disposed inside a shield member 550. The channel 200 may be disposed below a ring 540.

The shield member 550 is disposed at a side portion of a support member 500. The shield member 550 may serve to prevent a current flow between a chamber 100 and the support member 500.

To this end, the shield member 550 may include an insulating material or a dielectric material. For example, the shield member 550 may include a ceramic material or a polymer material, but embodiments of the present disclosure are not limited thereto.

Figure 6A:
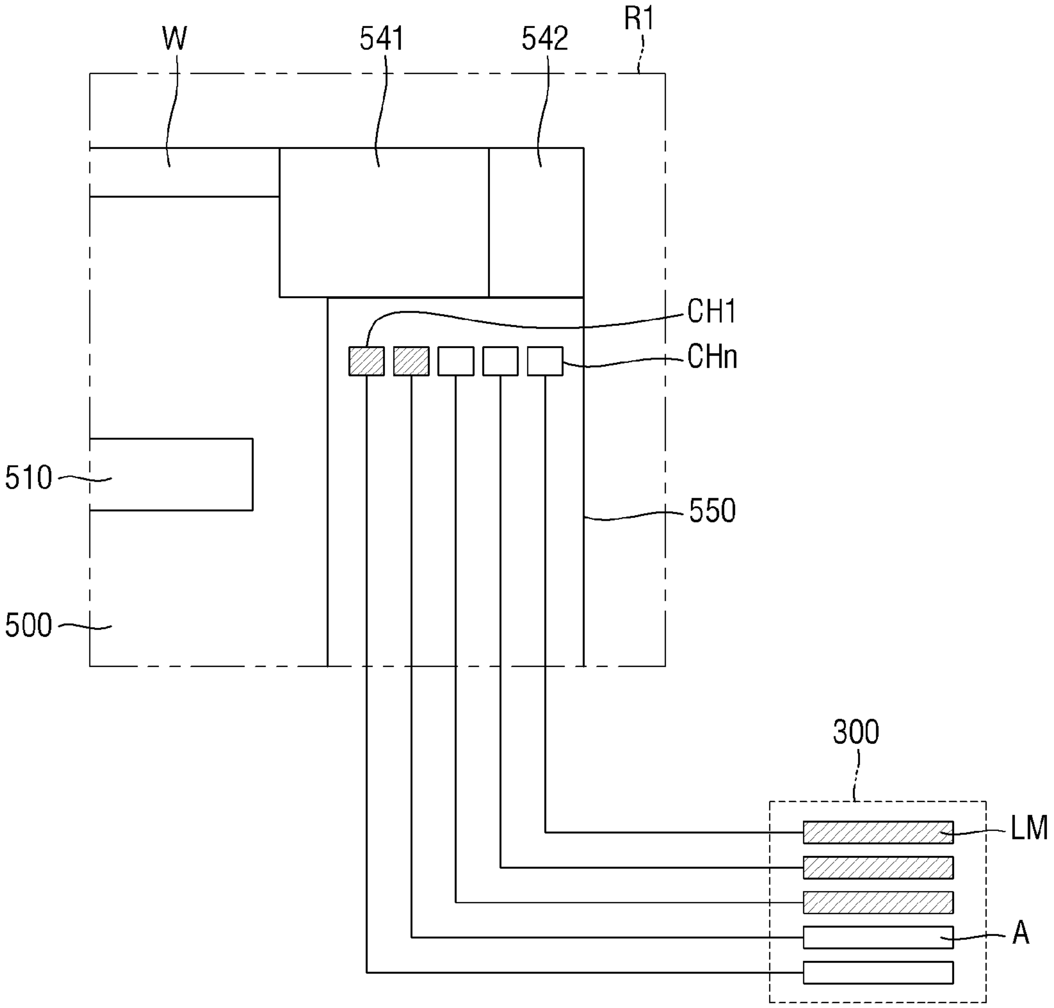
FIG. 6A is a view for describing a control unit and a channel of the substrate processing apparatus of FIG. 5, according to some example embodiments of the present disclosure.

Referring to FIG. 6A, the channel 200 may include a first channel CH1, closest to a central portion of a substrate W, and an $n^{th}$ channel CHn spaced apart from the first channel CH1 in a first direction X and closest to a peripheral portion of the substrate W. First to $n^{th}$ channels CH1 to CHn of the channel 200 may be spaced apart from each other to form a matrix shape inside the shield member 550.

All of the first to $n^{th}$ channels CH1 to CHn inside the shield member 550 may not be filled with a conductive fluid LM. For example, the first channel CH1 inside the shield member 550 may be filled with the conductive fluid LM, and the $n^{th}$ channel CHn inside the shield member 550 may not be filled with the conductive fluid LM.

The first to $n^{th}$ channels CH1 to CHn may be connected to a control unit 300. In this case, the contents described with reference to FIGS. 1 to 4 may be similarly applied to a connection relationship between the first to $n^{th}$ channels CH1 to CHn and the control unit 300 and a control method of a flow rate of each channel. That is, although not specifically shown, proportions or densities of the conductive fluid LM and a transport fluid A injected into each of the first to $n^{th}$ channels CH1 to CHn may be individually controlled by a first valve 320 of the control unit 300. In this case, the first valve 320 may control the conductive fluid LM and the transport fluid A so as to be alternately injected. In addition, a second valve 330 distributes the conductive fluid LM, which passes through the first valve 320, to at least one from among the first to $n^{th}$ channels CH1 to CHn. The first to $n^{th}$ channels CH1 to CHn into which the conductive fluid LM and the transport fluid A are injected may be selected by the second valve 330.

Meanwhile, shapes of the first to $n^{th}$ channels CH1 to CHn are not particularly limited, and the first to $n^{th}$ channels CH1 to CHn may be disposed to be spaced apart from each other so as to form a T-shape. In addition, as long as a desired plasma field is formed by compensating for asymmetry of a plasma field, the number and position of the first to $n^{th}$ channels CH1 to CHn filled with the conductive fluid LM are not limited to that shown in FIG. 6A.

Figure 6B:
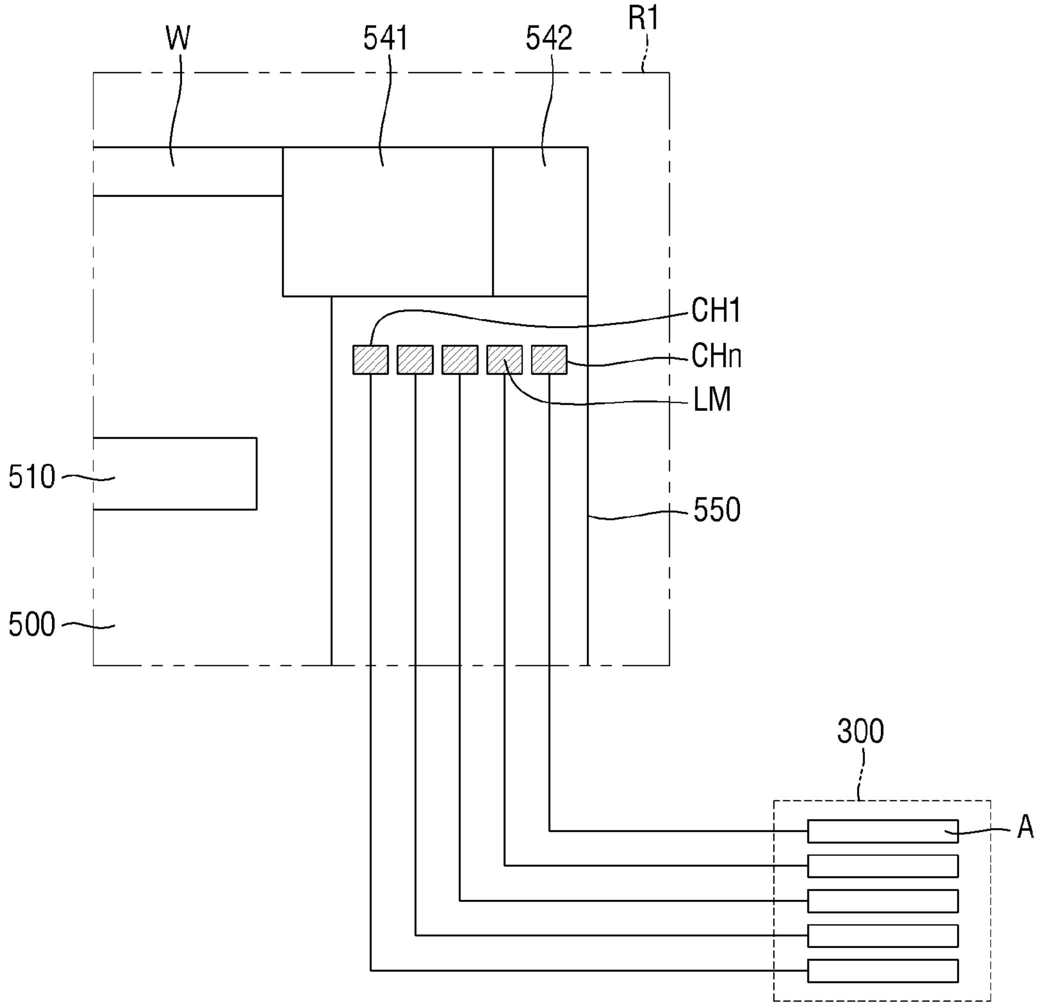
FIG. 6B is a view for describing a control unit and a channel of the substrate processing apparatus of FIG. 5, according to some example embodiments of the present disclosure.

Referring to FIG. 6B, all of the first to $n^{th}$ channels CH1 to CHn inside the shield member 550 may be filled with the conductive fluid LM. In this case, as the number of the first to $n^{th}$ channels CH1 to CHn into which the conductive fluid is injected is increased, a region, in which a plasma field is formed, or a density of the plasma field may be increased as compared with that of FIG. 6A.

Figure 6C:
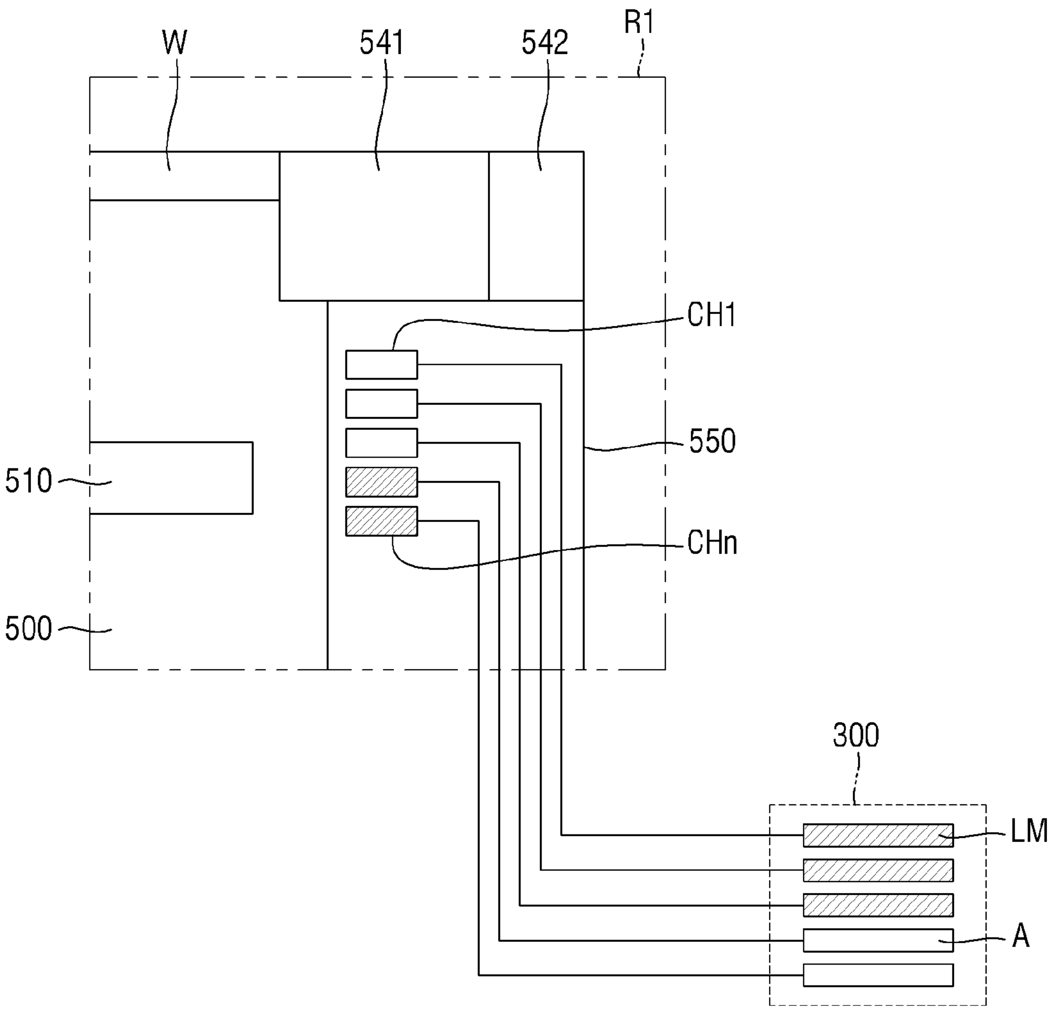
FIG. 6C is a view for describing a control unit and a channel of the substrate processing apparatus of FIG. 5, according to some example embodiments of the present disclosure.

Referring to FIG. 6C, the first to $n^{th}$ CH1 to CHn may include a first channel CH1 closest to the central portion of the substrate W and an $n^{th}$ channel CHn spaced apart from the first channel CH1 in a second direction Z intersecting the first direction X and closest to the peripheral portion of the substrate W. The first to $n^{th}$ channels CH1 to CHn may be disposed to be spaced apart from each other so as to form a matrix shape inside the shield member 550.

All of first to $n^{th}$ channels CH1 to CHn inside the shield member 550 may not be filled with the conductive fluid LM. For example, the $n^{th}$ channel CHn inside the shield member 550 may be filled with the conductive fluid LM, and the first channel CH1 inside the shield member 550 may not be filled with the conductive fluid.

The first to $n^{th}$ channels CH1 to CHn may be connected to the control unit 300. In this case, the contents described with reference to FIGS. 1 to 4 may be similarly applied to a connection relationship between the first to $n^{th}$ channels CH1 to CHn and the control unit 300 and a control method of a flow rate of each channel.

Meanwhile, shapes of the first to $n^{th}$ channels CH1 to CHn are not particularly limited, and the first to $n^{th}$ channels CH1 to CHn may be disposed to be spaced apart from each other in forms that further extend in the first direction X. In addition, as long as a desired plasma field is formed by compensating for asymmetry of a plasma field, the number and position of the first to $n^{th}$ channels CH1 to CHn filled with the conductive fluid LM are not limited to that shown in FIG. 6C.

Figure 6D:
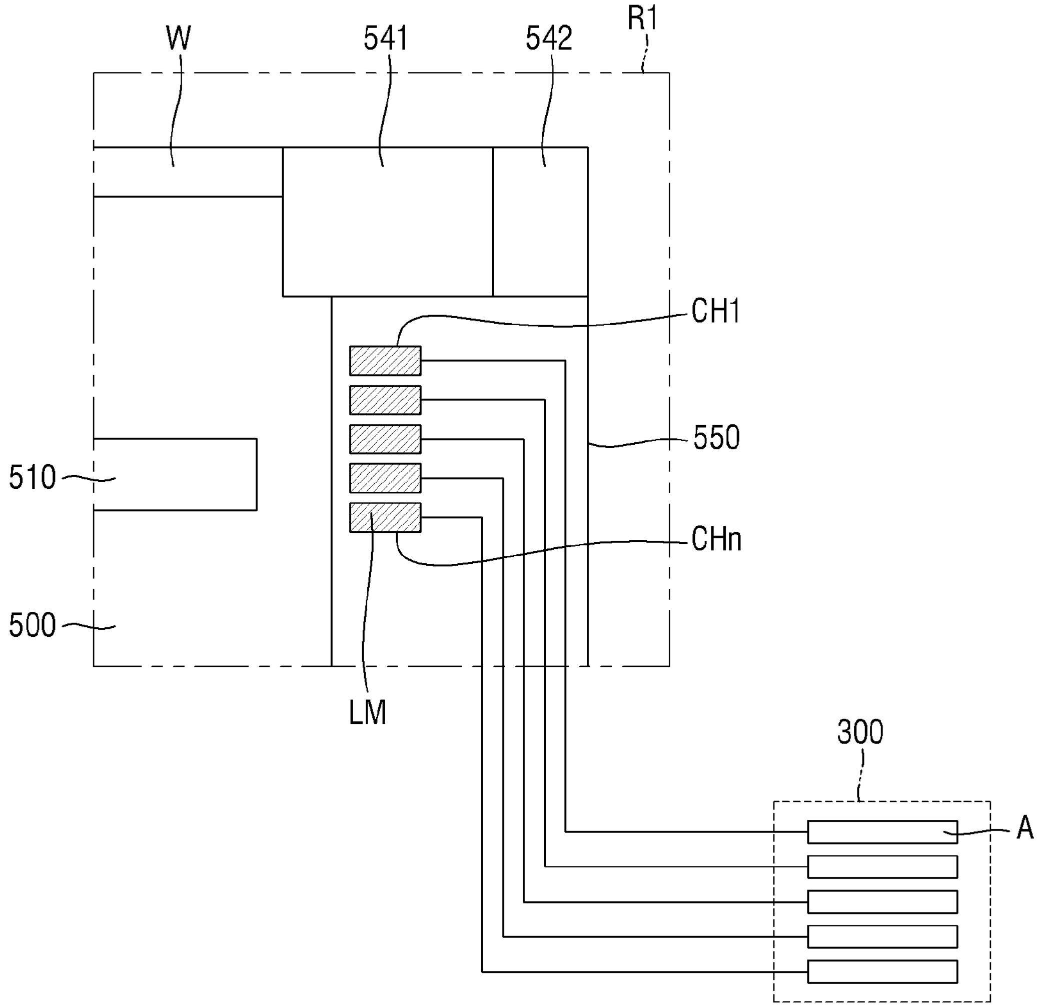
FIG. 6D is a view for describing a control unit and a channel of the substrate processing apparatus of FIG. 5, according to some example embodiments of the present disclosure.

Referring to FIG. 6D, all of the first to $n^{th}$ channels CH1 to CHn inside the shield member 550 may be filled with the conductive fluid LM. In this case, as the number of the first to $n^{th}$ channels CH1 to CHn into which the conductive fluid LM is injected is increased, a region, in which a plasma field is formed, or a density of the plasma field may be increased as compared with that of FIG. 6C.

Hereinafter, a substrate processing apparatus according to some example embodiments of the present disclosure will be described with reference to FIGS. 7 to 8B. For convenience of description, differences from the substrate processing apparatuses shown in FIGS. 1 to 6 will be mainly described.

Figure 7:
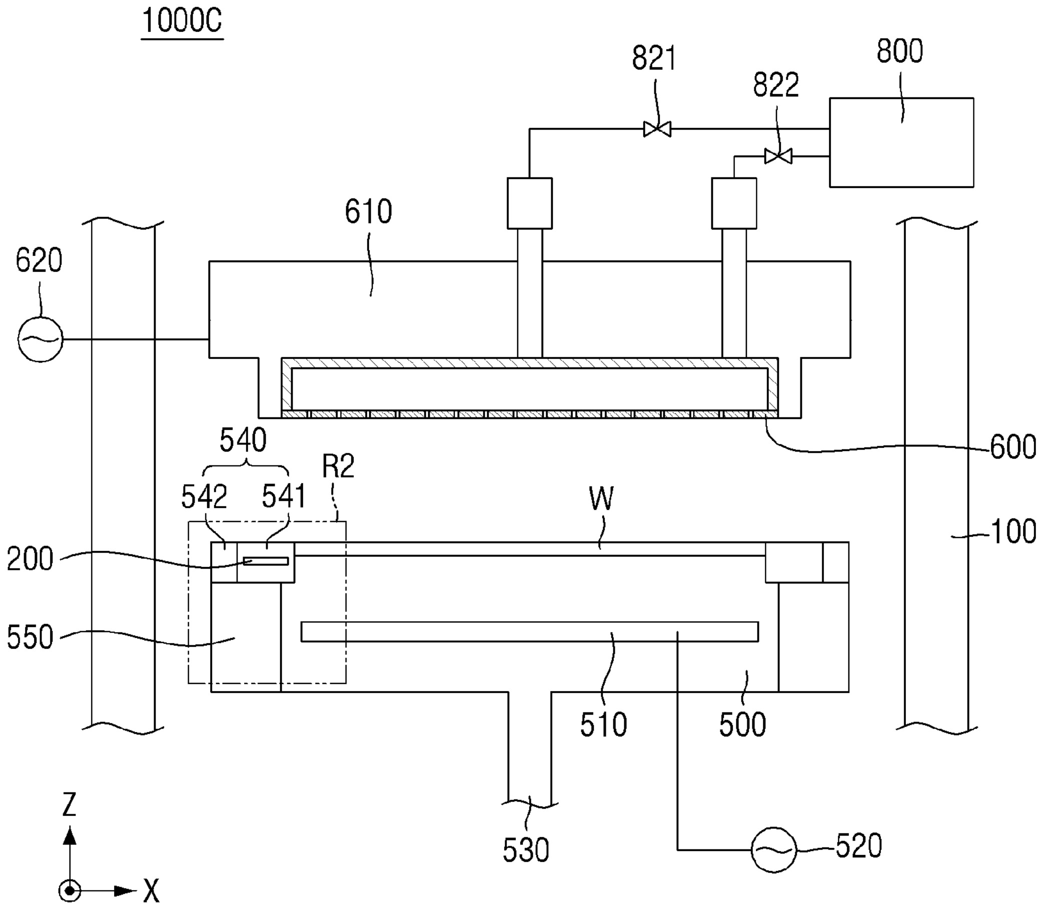
FIG. 7 is a view illustrating a substrate processing apparatus according to some example embodiments of the present disclosure.
Figure 8A:
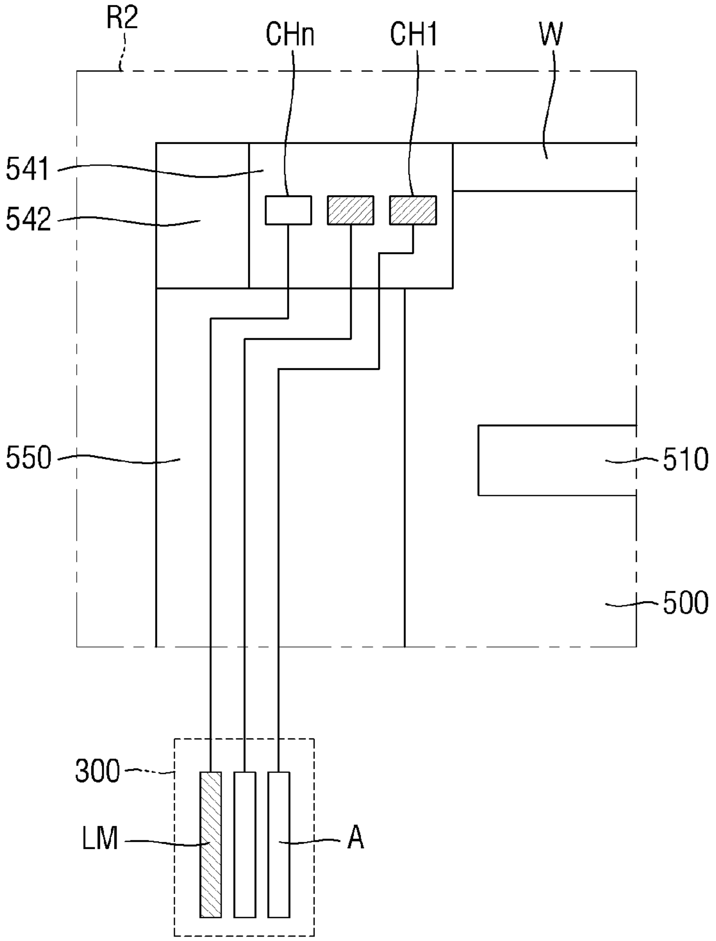
FIG. 8A is a view for describing a control unit and a channel of the substrate processing apparatus of FIG. 7, according to some example embodiments of the present disclosure.

FIG. 7 is a view illustrating a substrate processing apparatus 1000C according to some example embodiments of the present disclosure. FIGS. 8A to 8B are views for describing a control unit and a channel of the substrate processing apparatus 1000C of FIG. 7.

Referring to FIG. 7, a channel 200 may be disposed inside a ring 540. The channel 200 may be disposed inside a focus ring 541.

Referring to FIG. 8A, first to $n^{th}$ channels CH1 to CHn may include a first channel CH1 closest to a central portion of a substrate W and an $n^{th}$ channel CHn spaced apart from the first channel CH1 in a first direction X and closest to a peripheral portion of the substrate W. The first to $n^{th}$ channels CH1 to CHn may be disposed to be spaced apart from each other so as to form a matrix shape inside the focus ring 541.

All or some of the first to $n^{th}$ channels CH1 to CHn may not be filled with a conductive fluid LM. For example, the first channel CH1 may be filled with the conductive fluid LM, and the $n^{th}$ channel CHn may not be filled with the conductive fluid LM.

The first to $n^{th}$ channels CH1 to CHn may be connected to a control unit 300. In this case, the contents described with reference to FIGS. 1 to 4 may be similarly applied to a connection relationship between the first to $n^{th}$ channels CH1 to CHn and the control unit 300 and a control method of a flow rate of each channel. That is, although not specifically shown, proportions or densities of the conductive fluid LM and a transport fluid A injected into each of the first to $n^{th}$ channels CH1 to CHn may be individually controlled by a first valve 320 of the control unit 300. In this case, the first valve 320 may control the conductive fluid LM and the transport fluid A so as to be alternately injected. In addition, a second valve 330 distributes the conductive fluid LM, which passes through the first valve 320, to at least one from among the first to $n^{th}$ channels CH1 to CHn. The first to $n^{th}$ channels CH1 to CHn into which the conductive fluid and the transport fluid are injected may be selected by the second valve 330.

Meanwhile, shapes of the first to $n^{th}$ channels CH1 to CHn are not particularly limited, and the first to $n^{th}$ channels CH1 to CHn may be disposed to be spaced apart from each other in forms that extend in a second direction Z. In addition, as long as a desired plasma field is formed by compensating for asymmetry of a plasma field, the number and position of the first to $n^{th}$ channels CH1 to CHn filled with the conductive fluid LM are not limited to that shown in FIG. 8A.

Although not specifically shown, all of the first to $n^{th}$ channels CH1 to CHn may be filled with the conductive fluid LM. In this case, as the number of the first to $n^{th}$ channels CH1 to CHn into which the conductive fluid LM is injected is increased, a region, in which a plasma field is formed, or a density of the plasma field may be increased as compared with that of FIG. 8A.

Figure 8B:
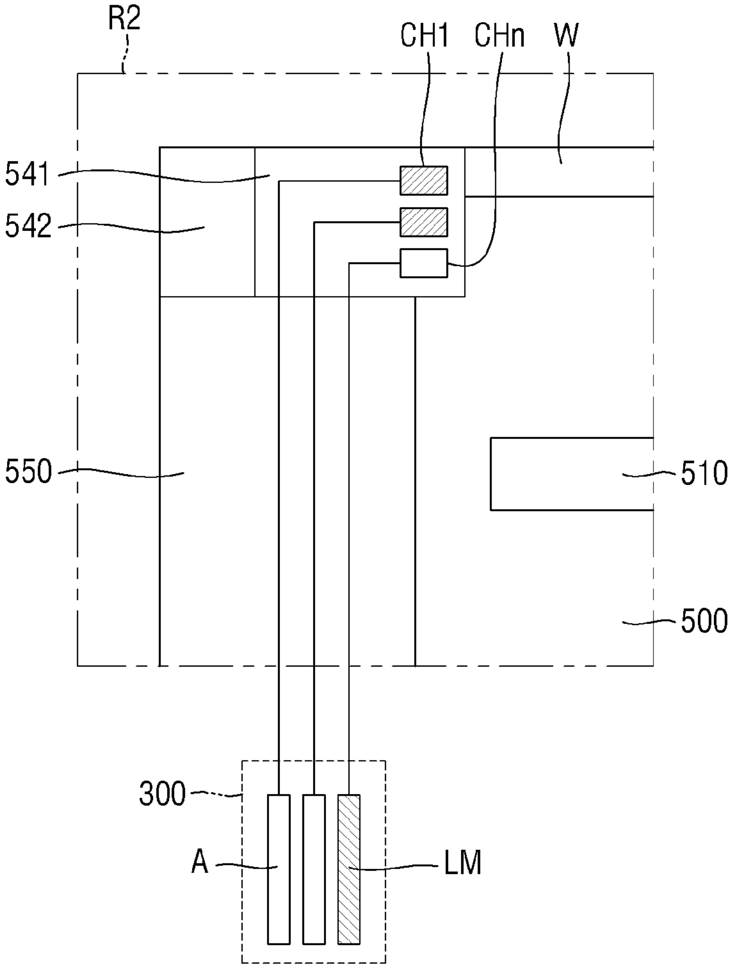
FIG. 8B is a view for describing a control unit and a channel of the substrate processing apparatus of FIG. 7, according to some example embodiments of the present disclosure.

Referring to FIG. 8B, first to $n^{th}$ channels CH1 to CHn may include a first channel CH1 closest to the central portion of the substrate W and an $n^{th}$ channel CHn spaced apart from the first channel CH1 in the second direction Z intersecting the first direction X and closest to the peripheral portion of the substrate W. The first to $n^{th}$ channels CH1, CH2, and CHn may be disposed to be spaced apart from each other so as to form a matrix shape inside the focus ring 541.

All or some of the first to $n^{th}$ channels CH1 to CHn may not be filled with the conductive fluid LM. For example, the first channel CH1 may be filled with the conductive fluid LM, and the $n^{th}$ channel CHn may not be filled with the conductive fluid LM.

The first to $n^{th}$ channels CH1 to CHn may be connected to the control unit 300. In this case, the contents described with reference to FIGS. 1 to 4 may be similarly applied to a connection relationship between the first to $n^{th}$ channels CH1 to CHn and the control unit 300 and a control method of a flow rate of each channel.

Meanwhile, shapes of the first to $n^{th}$ channels CH1 to CHn are not particularly limited, and the first to $n^{th}$ channels CH1 to CHn may be disposed to be spaced apart from each other in forms that further extend in the first direction X. In addition, as long as a desired plasma field is formed by compensating for asymmetry of a plasma field, the number and position of the first to $n^{th}$ channels CH1 to CHn filled with the conductive fluid LM are not limited to that shown in FIG. 8B.

Although not specifically shown, all of the first to $n^{th}$ channels CH1 to CHn may be filled with the conductive fluid LM. In this case, as the number of the first to $n^{th}$ channels CH1 to CHn into which the conductive fluid LM is injected is increased, a region, in which a plasma field is formed, or a density of the plasma field may be increased as compared with that of FIG. 8B.

Hereinafter, a substrate processing apparatus according to some example embodiments of the present disclosure will be described with reference to FIGS. 9 to 10. For convenience of description, differences from the substrate processing apparatuses shown in FIGS. 1 to 8 will be mainly described.

Figure 9:
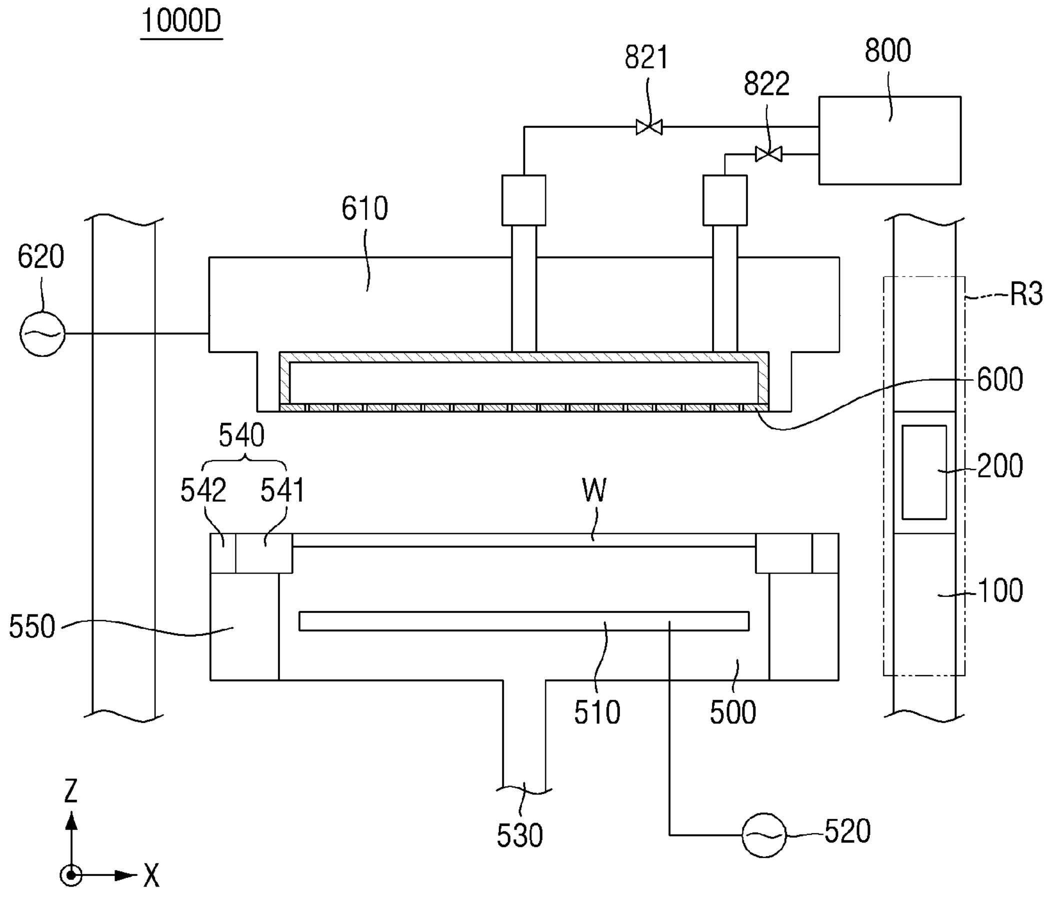
FIG. 9 is a view illustrating a substrate processing apparatus according to some example embodiments of the present disclosure.
Figure 10A:
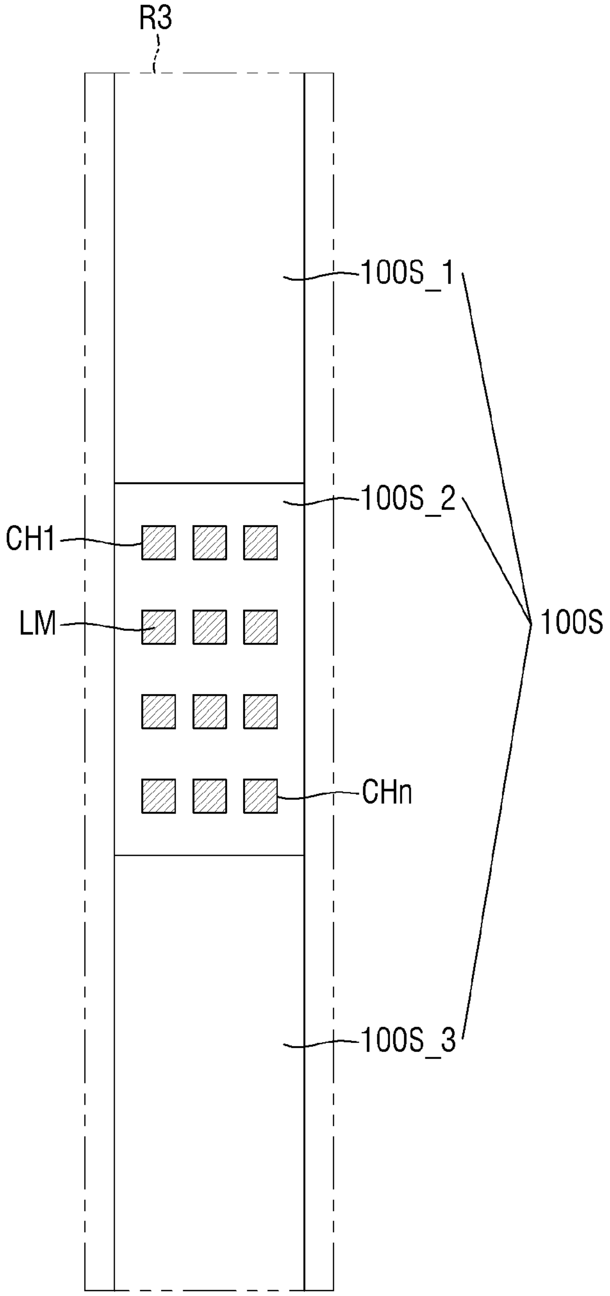
FIG. 10A is a view for describing a channel of the substrate processing apparatus of FIG. 9, according to some example embodiments of the present disclosure.
Figure 10B:
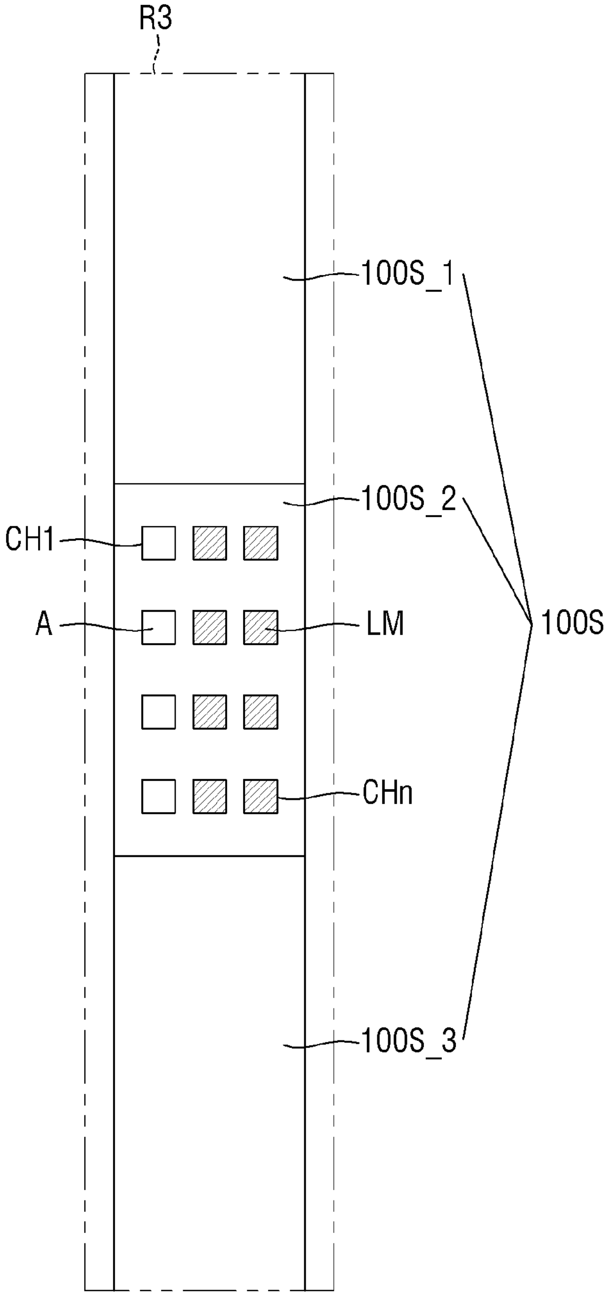
FIG. 10B is a view for describing a channel of the substrate processing apparatus of FIG. 9, according to some example embodiments of the present disclosure.
Figure 10C:
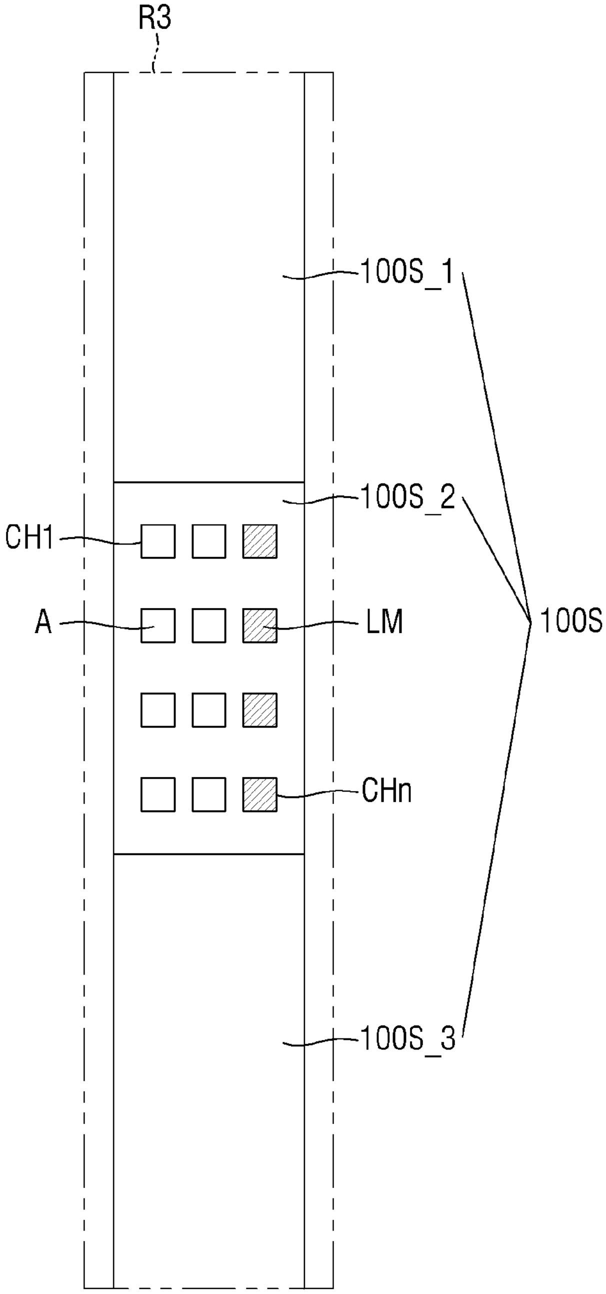
FIG. 10C is a view for describing a channel of the substrate processing apparatus of FIG. 9, according to some example embodiments of the present disclosure.

FIG. 9 is a view illustrating a substrate processing apparatus 1000D according to some example embodiments of the present disclosure. FIGS. 10A to 10C are views for describing a channel of the substrate processing apparatus of FIG. 9.

Referring to FIGS. 9-10C, a channel 200 may be disposed in a central region 100S_2 of a sidewall 100_S of a chamber corresponding to a region between a substrate W and a shower head 600.

Specifically, the sidewall 100_S of the chamber may include the central region 100S_2 corresponding to the region between the substrate W and the shower head 600 and peripheral regions 100S_1 and 100S_3 disposed above and below the central region 100S_2. The peripheral regions 100S_1 and 100S_3 may be formed integrally with the central region 100S_2. However, embodiments of the present disclosure are not limited thereto, and the peripheral regions 100S_1 and 100S_3 may be formed and attached through a process that is separate from that of the central region 100S_2.

Referring to FIG. 10A, first to $n^{th}$ channels CH1 to CHn may include a first channel CH1, closest to a central portion of the substrate W, and an $n^{th}$ channel CHn spaced apart from the first channel CH1 and closest to a peripheral portion of the substrate W. The first to $n^{th}$ channels CH1 to CHn may be disposed to be spaced apart from each other so as to form a matrix shape in the region of the sidewall 100_S of the chamber corresponding to the region between the substrate W and the shower head 600.

For example, all of the first to $n^{th}$ channels CH1 to CHn may be filled with a conductive fluid LM.

The first to $n^{th}$ channels CH1 to CHn may be connected to a control unit 300. In this case, the contents described with reference to FIGS. 1 to 4 may be similarly applied to a connection relationship between the first to $n^{th}$ channels CH1 to CHn and the control unit 300 and a control method of a flow rate of each channel.

Referring to FIGS. 10B and 10C, all or some of the first to $n^{th}$ channels CH1 to CHn may not be filled with the conductive fluid LM. For example, the first channel CH1 may not be filled with the conductive fluid LM, and the $n^{th}$ channel CHn may be filled with the conductive fluid LM.

Meanwhile, as long as a desired plasma field is formed by compensating for asymmetry of a plasma field, the number and position of the first to $n^{th}$ channels CH1 to CHn filled with the conductive fluid LM are not limited to those shown in FIGS. 10B and 10C.

Hereinafter, a substrate processing apparatus according to some example embodiments of the present disclosure will be described with reference to FIGS. 11 and 12. For convenience of description, differences from the substrate processing apparatuses shown in FIGS. 1 to 10 will be mainly described.

Figure 11:
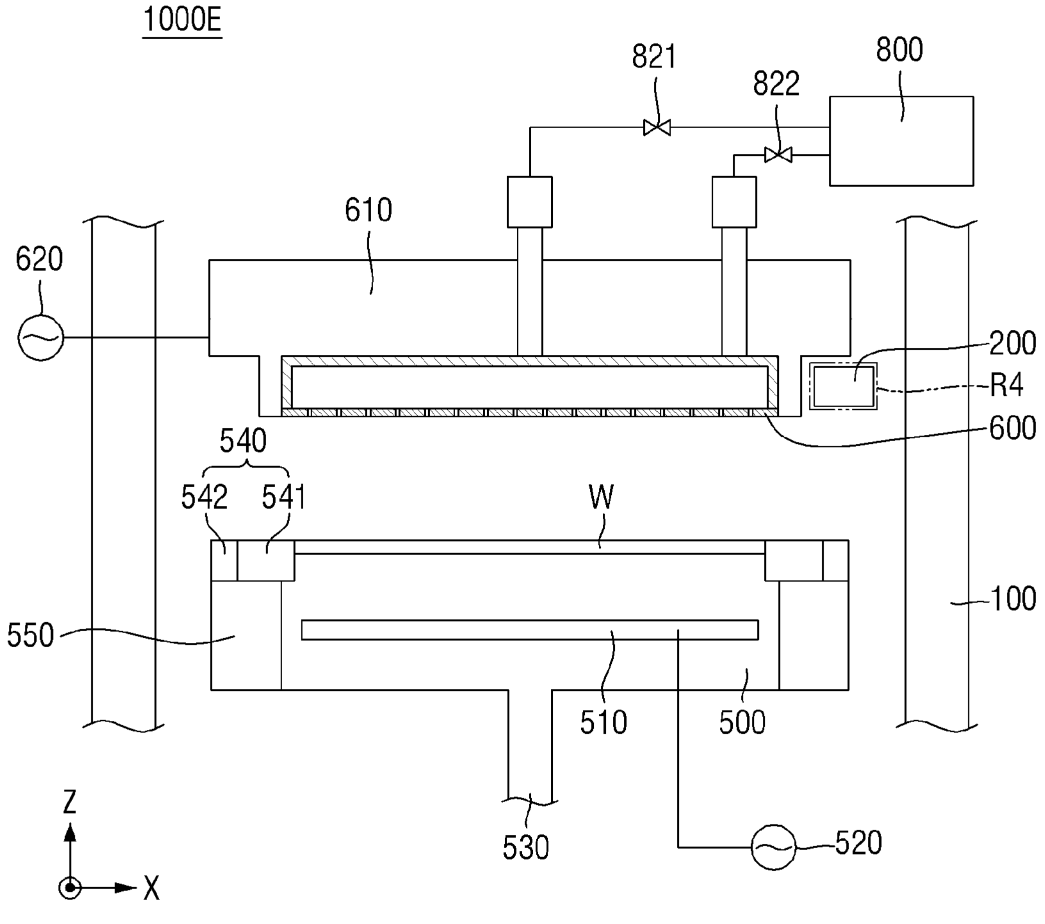
FIG. 11 is a view illustrating a substrate processing apparatus according to some example embodiments of the present disclosure.

FIG. 11 is a view illustrating a substrate processing apparatus 1000E according to some example embodiments of the present disclosure. FIG. 12 is a view for describing a channel of the substrate processing apparatus of FIG. 11.

Figure 12:
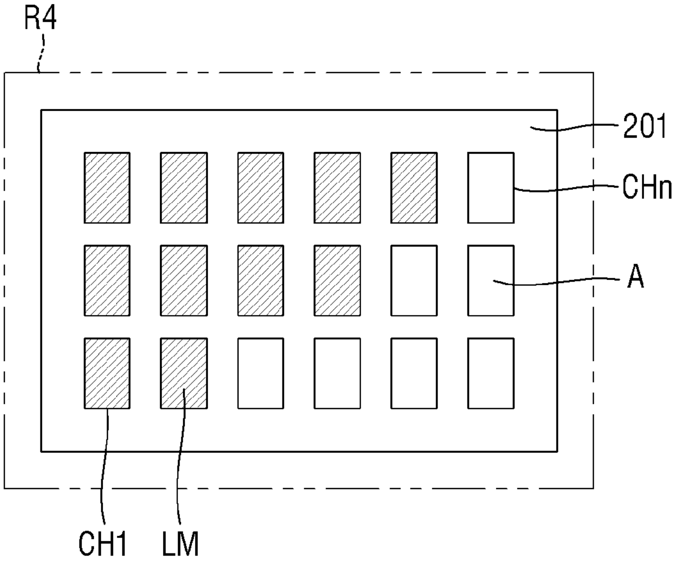
FIG. 12 is a view for describing a channel of the substrate processing apparatus of FIG. 11.

Referring to FIGS. 11 and 12, a channel 200 may be disposed in a region 201 between a sidewall 100_S of a chamber and a shower head 600.

Referring to FIG. 12, the channel 200 may include a first channel CH1 closest to a central portion of a substrate W and an $n^{th}$ channel CHn spaced apart from the first channel CH1 and closest to a peripheral portion of the substrate W. First to $n^{th}$ channels CH1 to CHn of the channel 200 may be disposed to be spaced apart from each other so as to form a matrix shape in the region 201 between the sidewall 100_S of the chamber and the shower head 600.

For example, the region 201 between the sidewall 100_S of the chamber and the shower head 600 may serve to adjust the thickness or shape of a second electrode 610. In addition, the region 201 between the sidewall 100_S of the chamber and the shower head 600 may include an insulating material or a dielectric material. However embodiments of the present disclosure are not limited thereto.

All or some of the first to $n^{th}$ channels CH1 to CHn may not be filled with a conductive fluid LM. For example, the first channel CH1 may be filled with the conductive fluid LM, and the $n^{th}$ channel CHn may not be filled with the conductive fluid LM.

Meanwhile, although not specifically shown, all of the first to $n^{th}$ channels CH1 to CHn may be filled with the conductive fluid LM.

The first to $n^{th}$ channels CH1 to CHn may be connected to a control unit 300. In this case, the contents described with reference to FIGS. 1 to 4 may be similarly applied to a connection relationship between the first to $n^{th}$ channels CH1 to CHn and the control unit 300 and a control method of a flow rate of each channel.

Meanwhile, as long as a desired plasma field is formed by compensating for asymmetry of a plasma field, the number and position of the first to $n^{th}$ channels CH1 to CHn filled with the conductive fluid LM are not limited to that shown in FIG. 12.

Figure 13:
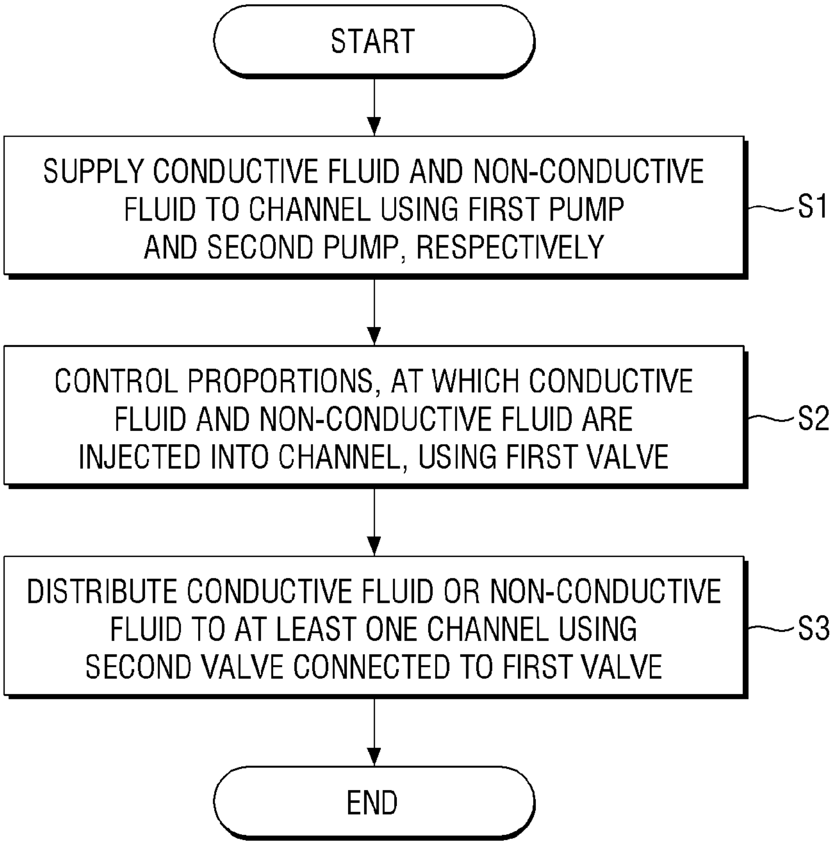
FIG. 13 is a diagram for describing a substrate processing method according to some example embodiments of the present disclosure.

FIG. 13 is a diagram for describing a substrate processing method according to some example embodiments of the present disclosure.

Referring to FIGS. 2 and 13, a conductive fluid LM and a transport fluid A are supplied to first to $n^{th}$ channels CH1, CH2, and CHn using a first pump 311 and a second pump 312, respectively (51). The conductive fluid LM may form a plasma field. In some example embodiments, the conductive fluid LM may be a liquid metal. In some example embodiments, the transport fluid A may be a non-conductive fluid.

Thereafter, proportions of the conductive fluid LM and the transport fluid A injected into each of the first to $n^{th}$ channels CH1, CH2, and CHn are controlled using a first valve 320 (S2). That is, the first valve 320 may control proportions of the conductive fluid LM and the transport fluid A in the first to $n^{th}$ channels CH1, CH2, and CHn. A proportion of each of the conductive fluid LM and the transport fluid A injected into the first channel CH1 and a proportion of each of the conductive fluid LM and the transport fluid A injected into the second channel CH2 are individually controlled by the first valve 320. For example, a proportion of each of the conductive fluid LM and the transport fluid A injected into the first channel CH1 may be different from a proportion of each of the conductive fluid LM and the transport fluid A injected into the second channel CH2. The first valve 320 may control the conductive fluid LM and the transport fluid A so as to be alternately injected.

Thereafter, the conductive fluid LM or the transport fluid A is distributed to at least one of the first to $n^{th}$ channels CH1, CH2, and CHn using the second valve 330 connected to the first valve 320 (S3). The first to $n^{th}$ channels CH1, CH2, and CHn into which the conductive fluid LM or the transport fluid A is injected may be selected by the second valve 330.

According to embodiments, the control unit 300 may further include at least one processor and memory storing computer instructions. The computer instructions, when executed by the at least one processor, may be configured to cause the at least one processor to control the control unit 300 to perform its functions. For example, the at least one processor may control the control unit 300 to perform the method described with reference to FIG. 13, by controlling one or more from among the first pump 311, the second pump 312, the first valve 320, and the second valve 330, based on inputs received from one or more from among the first sensor unit 410 and the second sensor unit 420.

Although the descriptions have been provided based on the substrate processing apparatus according to some example embodiments of the present disclosure shown in FIGS. 1 and 2, it will be apparent to those skilled in the art that the discretions may be applied to other example embodiments in substantially the same manner.

Although example embodiments of the present disclosure have been described with reference to the accompanying drawings, embodiments of the present disclosure are not limited to the example embodiments and may be prepared in various forms, and it will be understood by those skilled in the art to which the present disclosure pertains that the present disclosure can be carried out in other detailed forms without changing the technical spirits thereof. Therefore, it should be understood that the example embodiments described herein are illustrative and not restrictive in all aspects.

What is claimed is:

1. A substrate processing apparatus comprising:
a chamber comprising a support, the support configured to mount a substrate thereon;
at least one channel disposed in the chamber and into which an electrically conductive fluid or an electrically non-conductive fluid is configured to be injected; and
a control unit comprising:
a first pump and a second pump configured to respectively supply the electrically conductive fluid and the electrically non-conductive fluid to the at least one channel; and
a first valve configured to receive the electrically conductive fluid and the electrically non-conductive fluid from the first pump and the second pump, respectively, and control proportions of each of the electrically conductive fluid and the electrically non-conductive fluid at which the electrically conductive fluid and the electrically non-conductive fluid are injected into the at least one channel,
wherein the control unit is configured to alternately supply the electrically conductive fluid and the electrically non-conductive fluid to the at least one channel such that the electrically non-conductive fluid is provided between portions of the electrically conductive fluid within the at least one channel, and
the electrically conductive fluid is a liquid metal, and the electrically non-conductive fluid comprises at least one from among deionized water (DIW), air, and oil.

2. The substrate processing apparatus of claim 1, further comprising a second valve configured to distribute the electrically conductive fluid or the electrically non-conductive fluid, which passes through the first valve, to the at least one channel.

3. The substrate processing apparatus of claim 1, wherein:
the at least one channel comprises a first channel and a second channel,
the first channel, relative to the second channel, is closer to a first portion of the support on which a central portion of the substrate is configured to be provided,
the second channel, relative to the first channel, is closer to a second portion of the support on which a peripheral portion of the substrate is configured to be provided, and
the control unit is configured to individually control the proportions of each of the electrically conductive fluid and the electrically non-conductive fluid injected into the first channel and the proportions of each of the electrically conductive fluid and the electrically non-conductive fluid injected into the second channel.

4. The substrate processing apparatus of claim 3, wherein the control unit is configured to control the proportions of each of the electrically conductive fluid and the electrically non-conductive fluid injected into the first channel to be different from the proportions of each of the electrically conductive fluid and the electrically non-conductive fluid injected into the second channel.

5. The substrate processing apparatus of claim 1, wherein the first valve is configured to control the electrically conductive fluid and the electrically non-conductive fluid so as to be alternately injected.

6. The substrate processing apparatus of claim 5, wherein:
the electrically conductive fluid comprises a first unit electrically conductive fluid, a second unit electrically conductive fluid, and a third unit electrically conductive fluid which the control unit is configured to sequentially inject such that the first unit electrically conductive fluid, the second unit electrically conductive fluid, and the third unit electrically conductive fluid are spaced apart from each other within the at least one channel;
the electrically non-conductive fluid comprises a first unit electrically non-conductive fluid and a second unit electrically non-conductive fluid, and the control unit is configured to provide, within the at least one channel, the first unit electrically non-conductive fluid to be between the first unit electrically conductive fluid and the second unit electrically conductive fluid, and further provide, within the at least one channel, the second unit electrically non-conductive fluid to be spaced apart from the first unit electrically non-conductive fluid and placed between the second unit electrically conductive fluid and the third unit electrically conductive fluid; and
the control unit is configured to:
based on a first unit time being elapsed from a first time point at which the first unit electrically conductive fluid is injected, control the first valve to inject the second unit electrically conductive fluid into the at least one channel, and based on a second unit time being elapsed from a second time point at which the second unit electrically conductive fluid is injected, control the first valve to inject the third unit electrically conductive fluid into the at least one channel.

7. The substrate processing apparatus of claim 1, further comprising a sensor unit, comprising at least one sensor, configured to sense the electrically conductive fluid.

8. The substrate processing apparatus of claim 1, wherein the at least one channel is made of an electrically non-conductive material.

9. The substrate processing apparatus of claim 1, further comprising at least one electrode configured to form a plasma field within the chamber, and wherein the control unit is further configured to control the proportions at which the electrically conductive fluid and the electrically non-conductive fluid are injected into the at least one channel so as to adjust the plasma field.

10. The substrate processing apparatus of claim 1, further comprising a sensor unit, comprising at least one sensor, configured to sense a plasma field formed by the electrically conductive fluid.

11. A substrate processing apparatus comprising:

a chamber in which a plasma process is configured to be performed;

a support which is surrounded by a sidewall of the chamber, the support configured to mount a substrate thereon;

a shower head disposed above the support, and configured to spray a process gas on the substrate;

a ring disposed within the chamber, and configured to be at both sides of the substrate while the substrate is on the support;

a shield member, comprising at least one body, disposed below the ring;

at least one channel into which an electrically conductive fluid, for forming a plasma field, and an electrically non-conductive fluid are configured to be injected; and a control unit comprising a pump or a valve, and configured to alternately supply the electrically conductive fluid and the electrically non-conductive fluid to the at least one channel such that the electrically non-conductive fluid is provided between portions of the electrically conductive fluid within the at least one channel, and control proportions of each of the electrically conductive fluid and the electrically non-conductive fluid at which the electrically conductive fluid and the electrically non-conductive fluid are injected into the at least one channel, and wherein the electrically conductive fluid is a liquid metal, and the electrically non-conductive fluid comprises at least one from among deionized water (DIW), air, and oil.

12. The substrate processing apparatus of claim 11, wherein the control unit comprises:

a first pump and a second pump configured to respectively supply the electrically conductive fluid and the electrically non-conductive fluid to the at least one channel; and a first valve configured to receive the electrically conductive fluid and the electrically non-conductive fluid from the first pump and the second pump, respectively, and control the proportions of each of the electrically conductive fluid and the electrically non-conductive fluid at which the electrically conductive fluid and the electrically non-conductive fluid are injected into the at least one channel.

13. The substrate processing apparatus of claim 11, wherein:

the at least one channel comprises a first channel and a second channel, the first channel, relative to the second channel, is closer to a first portion of the support on which a central portion of the substrate is configured to be provided, the second channel, relative to the first channel is closer to a second portion of the support on which a peripheral portion of the substrate is configured to be provided, and the control unit is configured to individually control the proportions of each of the electrically conductive fluid and the electrically non-conductive fluid injected into the first channel and the proportions of each of the electrically conductive fluid and the electrically non-conductive fluid injected into the second channel.

14. The substrate processing apparatus of claim 11, wherein the at least one channel is disposed inside the support.

15. The substrate processing apparatus of claim 11, wherein the at least one channel is disposed inside the shield member.

16. The substrate processing apparatus of claim 11, wherein the at least one channel is disposed inside the ring.

17. The substrate processing apparatus of claim 11, wherein the at least one channel is disposed in a region of the sidewall of the chamber that is between the substrate and the shower head.

18. The substrate processing apparatus of claim 11, wherein the at least one channel is disposed in a region of the sidewall of the chamber corresponding to the shower head.

19. A substrate processing apparatus comprising:

a chamber in which a plasma process is performed;

a support which is disposed in the chamber and on which a substrate is mounted;

at least one channel into which an electrically conductive fluid, for forming a plasma field, or an electrically non-conductive fluid is injected;

a first pump and a second pump supplying the electrically conductive fluid and the electrically non-conductive fluid to the at least one channel respectively;

a first valve controlling proportions of each of the electrically conductive fluid and the electrically non-conductive fluid, at which the electrically conductive fluid and the electrically non-conductive fluid are injected into the at least one channel;

a second valve connected to the first valve, distributing the electrically conductive fluid or the electrically non-conductive fluid to the at least one channel; and a control unit, wherein the control unit is configured to alternately supply the electrically conductive fluid and the electrically non-conductive fluid to the at least one channel such that the electrically non-conductive fluid is provided between portions of the electrically conductive fluid within the at least one channel, and the electrically conductive fluid is a liquid metal, and the electrically non-conductive fluid comprises at least one from among deionized water (DIW), air, and oil.

20. The substrate processing apparatus of claim 19, wherein:

the at least one channel includes a first channel and a second channel, the first channel, relative to the second channel, is closer to a central portion of the substrate, the second channel, relative to the first channel, is closer to a peripheral portion of the substrate; and the proportions of each of the electrically conductive fluid and the electrically non-conductive fluid injected into the first channel and the proportions of each of the electrically conductive fluid and the electrically non-conductive fluid injected into the second channel are individually controlled.

* * * * *